(12) United States Patent
Xu et al.

(10) Patent No.: US 12,217,534 B2
(45) Date of Patent: Feb. 4, 2025

(54) DISPLAY PANEL AND DISPLAY APPARATUS

(71) Applicants: BEIJING BOE DISPLAY TECHNOLOGY CO., LTD., Beijing (CN); BOE Technology Group Co., Ltd., Beijing (CN)

(72) Inventors: Chuanxiang Xu, Beijing (CN); Shi Shu, Beijing (CN); Haitao Huang, Beijing (CN); Yang Yue, Beijing (CN); Yong Yu, Beijing (CN); Xiang Li, Beijing (CN); Qi Yao, Beijing (CN)

(73) Assignees: BEIJING BOE DISPLAY TECHNOLOGY CO., LTD., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/323,433

(22) Filed: May 25, 2023

(65) Prior Publication Data

US 2023/0298381 A1   Sep. 21, 2023

Related U.S. Application Data

(63) Continuation of application No. 17/232,167, filed on Apr. 16, 2021, now Pat. No. 11,721,122.

(30) Foreign Application Priority Data

May 29, 2020   (CN) .......................... 202010476642.4

(51) Int. Cl.
G06V 40/13   (2022.01)
H10K 50/80   (2023.01)
(Continued)

(52) U.S. Cl.
CPC ....... G06V 40/1318 (2022.01); H10K 50/865 (2023.02); H10K 50/868 (2023.02);
(Continued)

(58) Field of Classification Search
CPC ................ G06F 3/0412; G06F 3/0445; G06F 2203/04103; G06V 40/1306;
(Continued)

(56) References Cited

U.S. PATENT DOCUMENTS 10,216,975 B1   2/2019   He et al.
2019/0026527 A1   1/2019   He et al.
(Continued)

FOREIGN PATENT DOCUMENTS

CN   107978624 A   5/2018
CN   108807487 A   11/2018
(Continued)

OTHER PUBLICATIONS

EX Parte Quayle Action dated Dec. 19, 2022 for U.S. Appl. No. 17/232,167.

(Continued)

*Primary Examiner* — Julie Anne Watko
(74) *Attorney, Agent, or Firm* — Ling Wu; Stephen Yang; Ling and Yang Intellectual Property

(57) ABSTRACT

Provided are a display panel and a display apparatus. The display panel includes a sensor area, a first light shield layer disposed above the sensor area, and a color film layer disposed above the first light shield layer, the color film layer includes color filters with different colors and a light transmission part disposed between the color filters with different colors; the first light shield layer includes a first opening and a light shield part, the light transmission part and the first opening are configured to allow at least partial light to transmit the sensor area and the color film layer further includes a first black matrix disposed between the color filters with different colors, the first black matrix is provided with a second opening which forms the light transmission
(Continued)

part. The display panel includes a touch structure layer, the touch structure layer includes a plurality of touch electrodes.

20 Claims, 19 Drawing Sheets

(51) Int. Cl.
| | |
|---|---|
| *H10K 50/84* | (2023.01) |
| *H10K 50/86* | (2023.01) |
| *H10K 59/122* | (2023.01) |
| *H10K 59/126* | (2023.01) |
| *H10K 59/38* | (2023.01) |
| *H10K 59/65* | (2023.01) |
| *G06F 3/041* | (2006.01) |
| *H10K 50/30* | (2023.01) |
| *H10K 59/121* | (2023.01) |
| *H10K 59/80* | (2023.01) |

(52) U.S. Cl.
CPC .......... *H10K 59/122* (2023.02); *H10K 59/38* (2023.02); *H10K 59/65* (2023.02); *G06F 3/0412* (2013.01); *H10K 50/30* (2023.02); *H10K 59/1213* (2023.02); *H10K 59/126* (2023.02); *H10K 59/8792* (2023.02)

(58) Field of Classification Search
CPC .... G06V 40/1318; G09F 9/301; H10K 50/30; H10K 50/84; H10K 50/868; H10K 59/1213; H10K 59/122; H10K 59/124; H10K 59/126; H10K 59/38; H10K 59/65; H10K 59/873; H10K 59/8792; H01L 27/322; H01L 27/3225; H01L 27/323; H01L 27/3234; H01L 27/3244; H01L 27/3246; H01L 27/3258; H01L 27/3262; H01L 27/3272; H01L 51/5237; H01L 51/5281; H01L 51/5284; H01L 51/5293; H01L 51/5296; H01L 51/56; H01L 2227/323

See application file for complete search history.

(56) References Cited

U.S. PATENT DOCUMENTS

| | | | |
|---|---|---|---|
| 2019/0172886 A1 | 6/2019 | Ma et al. | |
| 2019/0237521 A1* | 8/2019 | Ju | H10K 50/865 |
| 2020/0226341 A1 | 7/2020 | He et al. | |
| 2020/0242319 A1 | 7/2020 | Zeng et al. | |
| 2020/0379602 A1 | 12/2020 | Zeng et al. | |
| 2020/0380238 A1 | 12/2020 | Zeng et al. | |
| 2022/0351540 A1* | 11/2022 | Hai | H10K 50/86 |
| 2022/0358782 A1 | 11/2022 | Wang et al. | |
| 2022/0367582 A1* | 11/2022 | Wang | H10K 59/60 |
| 2023/0096025 A1* | 3/2023 | Li | H01L 27/14623 |
| | | | 382/124 |
| 2023/0142687 A1* | 5/2023 | Ren | H10K 59/122 |
| | | | 257/40 |

FOREIGN PATENT DOCUMENTS

| | | |
|---|---|---|
| CN | 109784303 A | 5/2019 |
| CN | 109858398 A | 6/2019 |
| CN | 110175592 A | 8/2019 |
| CN | 110970480 A | 4/2020 |
| CN | 111106157 A | 5/2020 |
| WO | WO-2017214582 A1 | 12/2017 |

OTHER PUBLICATIONS

Office Action dated Aug. 3, 2022 for U.S. Appl. No. 17/232,167.
Notice of Allowance dated Nov. 7, 2022 for Chinese Patent Application No. 202010476642.4 and English Translation.
Notice of Allowance dated Mar. 23, 2023 for U.S. Appl. No. 17/232,167.
Office Action dated Jul. 16, 2024 for U.S. Appl. No. 17/740,399.

* cited by examiner

DISPLAY PANEL AND DISPLAY APPARATUS

CROSS-REFERENCE TO RELATED APPLICATION(S)

This application is a continuation of U.S. patent application Ser. No. 17/232,167 filed on Apr. 16, 2021, which claims the priority of Chinese Patent Application No. 202010476642.4 filed to the CNIPA on May 29, 2020, the contents of the above identified applications are hereby incorporated by reference.

TECHNICAL FIELD

The present disclosure relates to, but is not limited to, the field of display technology, and particularly relates to a display panel, a method for manufacturing the display panel, and a display apparatus.

BACKGROUND

An Organic Light Emitting Diode (OLED) is an active light emitting display device, and has advantages of self-emission, wide view angle, high contrast, low power consumption, extremely high response speed, etc. With the continuous development of display technology, the OLED technology is increasingly applied in flexible display apparatuses.

With the large-scale application of 5G, there is a high demand for electronic devices to reduce the power consumption of screens, and CF on Encapsulation (COE) technology has come into being. Compared with circular polarizer, the COE technology has higher transmittance and may reduce power consumption of OLED products. The COE technology uses black matrix (BM) and Color Filter (CF) as anti-reflection layers to reduce the reflection of external ambient light by reflective metal. However, fingerprint identification technology is widely used in high-end smart phones at present, especially under-screen and in-screen fingerprint identifications have become a trend. However, the COE technology may not be able to identify fingerprints because there is no light passing through the screen because of the occlusion of the black matrix.

SUMMARY

The following is a summary of the subject matter described in detail in the present disclosure. This summary is not intended to limit the protection scope of the claims.

The embodiment of the present disclosure provides a display panel, which includes a sensor area, a first light shield layer disposed above the sensor area, and a color film layer disposed above the first light shield layer, the color film layer includes color filters with different colors and a light transmission part disposed between the color filters with different colors; the first light shield layer includes a first opening and a light shield part, the light transmission part and the first opening are configured to allow at least partial light to transmit the sensor area; the color film layer further includes a first black matrix disposed between the color filters with different colors, the first black matrix is provided with a second opening which forms the light transmission part, there is an overlapping area between an orthographic projection of the second opening on a base substrate and an orthographic projection of the first opening on the base substrate; the display panel further includes a touch structure layer, the touch structure layer includes a plurality of touch electrodes, and there is no overlapping between an orthographic projection of the touch electrodes on the base substrate and an orthographic projection of the first opening on the base substrate; and there is no overlapping between the orthographic projection of the touch electrodes on the base substrate and an orthographic projection of the second opening on the base substrate.

In some exemplary embodiments, there is an overlapping between an orthographic projection of the first black matrix on the base substrate and the orthographic projection of the touch electrodes on the base substrate; and/or there is an overlapping between an orthographic projection of the first light shield part on the base substrate and the orthographic projection of the touch electrodes on the base substrate.

In some exemplary embodiments, the first light shield layer includes a plurality of first openings and each of the plurality of first openings is the first opening, and the first openings are arranged at intervals, and a distance between two adjacent first openings ranges from 20 μm to 800 μm.

In some exemplary embodiments, a distance between an edge of the orthographic projection of the touch electrodes and an edge of the orthographic projection of the first opening on the base substrate is between 0 μm and 20 μm.

In some exemplary embodiments, the display panel further includes a cover plate, a distance between the cover plate and the second opening in a direction perpendicular to the display panel is greater than a distance between the second opening and the sensor area in the direction perpendicular to the display panel; an aperture of the second opening is smaller than or equal to an aperture of the first opening.

In some exemplary embodiments, the display panel further includes a base substrate and a plurality of pixel units disposed in a matrix on the base substrate, each pixel unit includes a plurality of sub-pixels, and each sub-pixel includes a drive structure layer, a first planarization layer, a first electrode and a pixel define layer, the drive structure layer is disposed on the base substrate, and the drive structure layer in each sub-pixel includes a first thin film transistor; the first planarization layer is disposed on the drive structure layer; the first electrode is disposed on the first planarization layer and connected to the first thin film transistor in the drive structure layer through a via hole provided on the first planarization layer; and the pixel define layer is disposed on the first planarization layer and includes a plurality of pixel openings and retaining walls around the pixel openings, and the pixel openings expose the first electrode.

In some exemplary embodiments, each sub-pixel further includes a spacer layer, an organic light emitting layer, a second electrode and an encapsulation layer, the spacer layer is disposed on the pixel define layer; the organic light emitting layer is disposed on the first electrode; the second electrode is disposed on the organic light emitting layer; and/or the encapsulation layer is disposed on the second electrode, and a projection of the encapsulation layer on the base substrate covers the entire substrate.

In some exemplary embodiments, each sub-pixel further includes the color film layer and an encapsulation layer, the color film layer is disposed on the encapsulation layer; the display panel further includes a touch structure layer disposed between the encapsulation layer and the color film layer, the touch structure layer includes a plurality of touch electrodes, and an orthographic projection of the touch electrodes on the base substrate does not overlap with an orthographic projection of the organic light emitting layer on the base substrate.

In some exemplary embodiments, a material of a retaining wall is an organic light shield material, the retaining wall is provided with the first opening and forms the light shield part.

In some exemplary embodiments, a material of the first planarization layer is an organic light shield material, the first planarization layer is provided with the first opening, and forms the light shield part.

In some exemplary embodiments, the drive structure layer includes a buffer layer, an active layer, a first gate insulating layer, a first gate electrode layer, a second gate insulating layer, a second gate electrode layer, a first interlayer insulating layer, a first source-drain metal layer, a second interlayer insulating layer and a second source-drain metal layer which are sequentially stacked on the base substrate, and the second source-drain metal layer is provided with the first opening and forms the first light shield layer.

In some exemplary embodiments, the drive structure layer includes a buffer layer, an active layer, a first gate insulating layer, a first gate electrode layer, a second gate insulating layer, a second gate electrode layer, a first interlayer insulating layer and a first source-drain metal layer which are sequentially stacked on the base substrate, and the first light shield layer is disposed between the base substrate and the buffer layer.

In some exemplary embodiments, the base substrate includes a first base substrate and a second base substrate, and the first light shield layer is disposed between the first base substrate and the second base substrate; and/or a base film is disposed on a surface of the base substrate away from the drive structure layer, and the sensor area is attached to a surface of the base film away from the base substrate.

In some exemplary embodiments, the sensor area is disposed between the drive structure layer and the first planarization layer, and the drive structure layer further includes a second thin film transistor which is configured to turn on or off the sensor area. In some exemplary embodiments, the display panel further includes a filter layer disposed above the sensor area and on a path where the fingerprint reflected light passes through the first opening to reach the sensor area.

In some exemplary embodiments, the color film layer further includes a polarizer disposed between the color filters with different colors, the polarizer forms the light transmission part, and the first opening pin-hole images a fingerprint in contact with the display panel onto the sensor area.

In some exemplary embodiments, the display panel further includes a cover plate, a distance between the cover plate and the first opening in a direction perpendicular to the display panel is greater than a distance between the first opening and the sensor area in the direction perpendicular to the display panel.

In some exemplary embodiments, the display panel further includes a touch structure layer and a second black matrix layer sequentially stacked on the color film layer, the touch structure layer includes a plurality of touch electrodes; the second black matrix layer includes a plurality of second black matrices with third openings, an orthographic projection of the second black matrices on the base substrate covers an orthographic projection of the touch electrodes on the base substrate, and there is an overlapping area between an orthographic projection of a third opening on the base substrate and an orthographic projection of the first opening on the base substrate.

In some exemplary embodiments, the display panel further includes a filter layer disposed above the sensor area, the filter layer is disposed on the light transmission part between the color filters with different colors, or the spacer layer includes a filter material with a first color as the filter layer, and the filter material with the first color is configured to filter out light that interferes with the fingerprint reflected light.

An exemplary embodiment of the present disclosure further provides a display apparatus, includes the display panel described above.

Of course, an implementation of any product or method in the embodiments of the present disclosure does not need to achieve all the advantages mentioned above at the same time. Other features and advantages of the present disclosure will be set forth in the following embodiment of the description, and in part will become apparent from the embodiment of the description, or be learned by practice of the present disclosure. Purposes and other advantages of the technical solutions of the present disclosure may be achieved and acquired by structures specified in the description and drawings.

Other aspects will become apparent upon reading and understanding accompanying drawings and the detailed description.

BRIEF DESCRIPTION OF THE DRAWINGS

The accompanying drawings are used to provide a further understanding of the technical solution of the present disclosure, and constitute a part of the specification. They are used together with the embodiments of the present application to explain the technical solution of the present disclosure, and do not constitute a restriction on the technical solution of the present disclosure. Shapes and sizes of the components in the accompanying drawings do not reflect true scales and are only used to schematically illustrate contents of the present disclosure.

DETAILED DESCRIPTION

Figure 1:
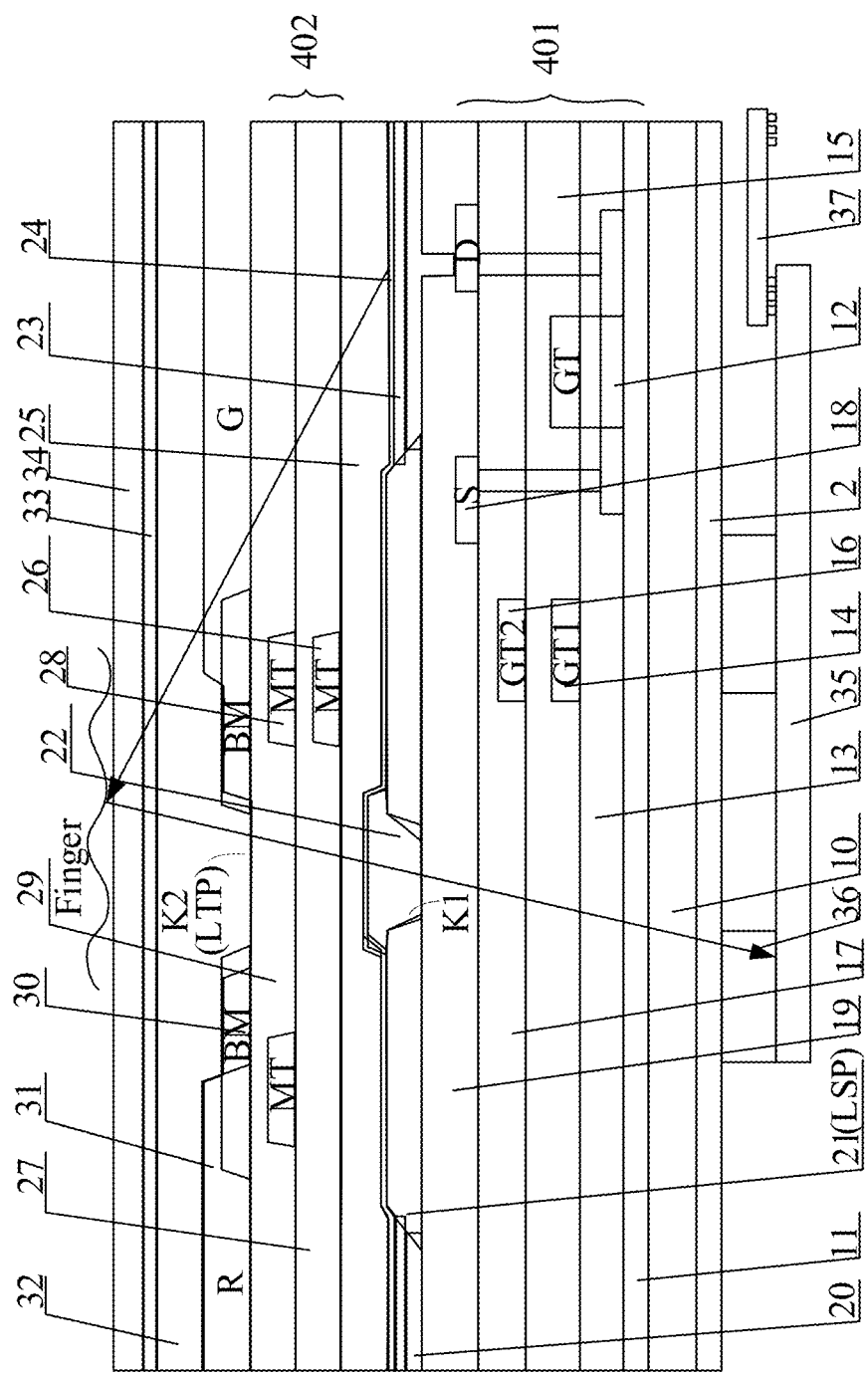
FIG. 1 is a first schematic diagram of a structure of a display panel according to a first embodiment of the present disclosure.

Specific implementations of the present disclosure will be described in further detail below with reference to the accompanying drawings and embodiments. The following embodiments serve to illustrate the present disclosure, but are not intended to limit the scope of the present disclosure. It should be noted that embodiments in the present disclosure and features in the embodiments may be combined with each other arbitrarily if there is no conflict.

An embodiment of the present disclosure provides a display panel, which includes a sensor area, for example, the sensor area are provided with one fingerprint identification sensor or a plurality of fingerprint identification sensors, a first light shield layer disposed on the fingerprint identification sensor and a color film layer disposed on the first light shield layer, wherein the color film layer includes color filters with different colors and a light transmission part disposed between the color filters with different colors. The first light shield layer includes a first opening and a light shield part, wherein the light transmission part and the first opening are used for allowing fingerprint reflected light to transmit and reach the fingerprint identification sensor, and the light shield part is used for blocking out stray light. The stray light in the embodiments of the present disclosure includes stray light reflected by a touch electrode in a touch structure layer from light emitted by an organic light emitting layer.

According to the display panel provided in the embodiment of the present disclosure, stray light is blocked out by the light shield part, and fingerprint reflected light is allowed to transmit and reach the fingerprint identification sensor through the light transmission parts and the first openings, so that light may pass through the screen for performing fingerprint identification without increasing power consumption, thus the display panel has simple manufacturing process and high production efficiency, with advantages such as low production cost and high yield, and has a great application prospect.

The display panel of the embodiment of the present disclosure may be implemented by various solutions. The following will be described in detail by embodiments.

In an embodiment of the present disclosure, FIGS. 1 to 5 are schematic diagrams of five structures of a display panel according to an embodiment of the present disclosure. A main structure of the display panel of the present embodiment includes multiple pixel units disposed in a matrix, wherein each pixel unit includes multiple sub-pixels. For example, each pixel unit may include three sub-pixels, namely a red sub-pixel R, a green sub-pixel G and a blue sub-pixel B. In the present embodiment, a second opening K2 is disposed on a first black matrix 30 between color filters 31 with different colors, and a fingerprint in contact with the display panel is pin-hole imaged onto a fingerprint identification sensor 35 through the second opening K2. Pin-hole imaging is a physical phenomenon. When a plate with a pin hole is used to shield between a wall and an object, an inverted image of the object will be formed on the wall, and such phenomenon is called pin-hole imaging.

As shown in FIGS. 1 to 5, the display panel of the present embodiment includes a base substrate 10 and multiple pixel units disposed in a matrix on the base substrate 10, wherein each pixel unit includes multiple sub-pixels, and each sub-pixel includes a drive structure layer 401, a first planarization layer 19, a first electrode 20, a pixel define layer 21, a spacer layer 22, an organic light emitting layer 23, a second electrode 24 and an encapsulation layer 25.

Herein, the drive structure layer 401 is disposed on the base substrate 10, and the drive structure layer 401 in each sub-pixel includes a first thin film transistor. The first planarization layer 19 is disposed on the drive structure layer 401. The first electrode 20 is disposed on the first planarization layer 19 and connected to the first thin film transistor in the drive structure layer 401 through a via hole provided on the first planarization layer 19. The pixel define layer 21 disposed on the first planarization layer 19 includes multiple pixel openings and retaining walls around the pixel openings, wherein the pixel openings expose the first electrode 20. The spacer layer 22 is disposed on the pixel define layer 21. The organic light emitting layer 23 is disposed on the first electrode 20. The second electrode 24 is disposed on the organic light emitting layer 23. The encapsulation layer 25 is disposed on the second electrode 24 and covers the entire base substrate 10. The color film layer is disposed above the encapsulation layer 25.

As shown in FIG. 1 to FIG. 5, the color film layer of the present embodiment includes color filters 31 with different colors and a first black matrix 30 disposed between the color filters 31 with different colors. The first black matrix 30 is provided with the second opening K2, there is an overlapping area between an orthographic projection of the second openings K2 on the base substrate 10 and an orthographic projection of the fingerprint identification sensor 35 on the base substrate 10, and the second opening K2 pin-hole images a fingerprint in contact with the display panel onto the fingerprint identification sensor 35, and the second openings K2 form a light transmission part LTP.

As shown in FIGS. 1 to 5, the display panel of the present embodiment further includes a cover plate 34. In an exemplary embodiment, a distance between the cover plate 34 and the second opening K2 in a direction perpendicular to the display panel is greater than a distance between the second opening K2 and the fingerprint identification sensor 35 in the direction perpendicular to the display panel. Since a distance between the second opening K2 and an outermost side of a screen is an object distance, and the distance between the second opening K2 and the fingerprint identification sensor 35 is an image distance, the imaging area may be increased and the density and number of pinhole arrays may be reduced when the object distance is greater than the image distance.

In an exemplary embodiment, in order to increase the distance between the cover plate 34 and the second openings K2 in the direction perpendicular to the display panel, the cover plate 34 may be made into a multilayer structure. For example, the cover plate 34 may be made into a double-layer structure.

In an exemplary embodiment, a shape of the first openings K1 and/or the second openings K2 may be square, circle, polygonal, etc.

In an exemplary embodiment, an aperture of the first opening K1 and/or the second opening K2 may be 3 to 30 microns.

In an exemplary embodiment, an aperture of the second opening K2 is smaller than or equal to an aperture of the first opening K1 to avoid a decrease of the imaging area.

As shown in FIG. 1 to FIG. 5, the display panel of the present embodiment further includes a touch structure layer 402, wherein the touch structure layer 402 is disposed between the encapsulation layer 25 and the color film layer. The touch structure layer 402 includes multiple touch electrodes (MT in FIGS. 1 to 5 is an abbreviation of Metal, while in the present disclosure, MT stands for a touch electrode), and an orthographic projection of the first black matrix 30 on the base substrate 10 includes an orthographic projection of the touch electrode on the base substrate 10.

In an exemplary embodiment, as shown in FIG. 1, a material of the retaining wall is an organic light shield material, and the retaining wall is provided with the first opening K1, and the retaining wall forms the light shield part (LSP). A material of the first planarization layer 19 in FIG. 1 is an organic light-transmitting material.

Figure 2:
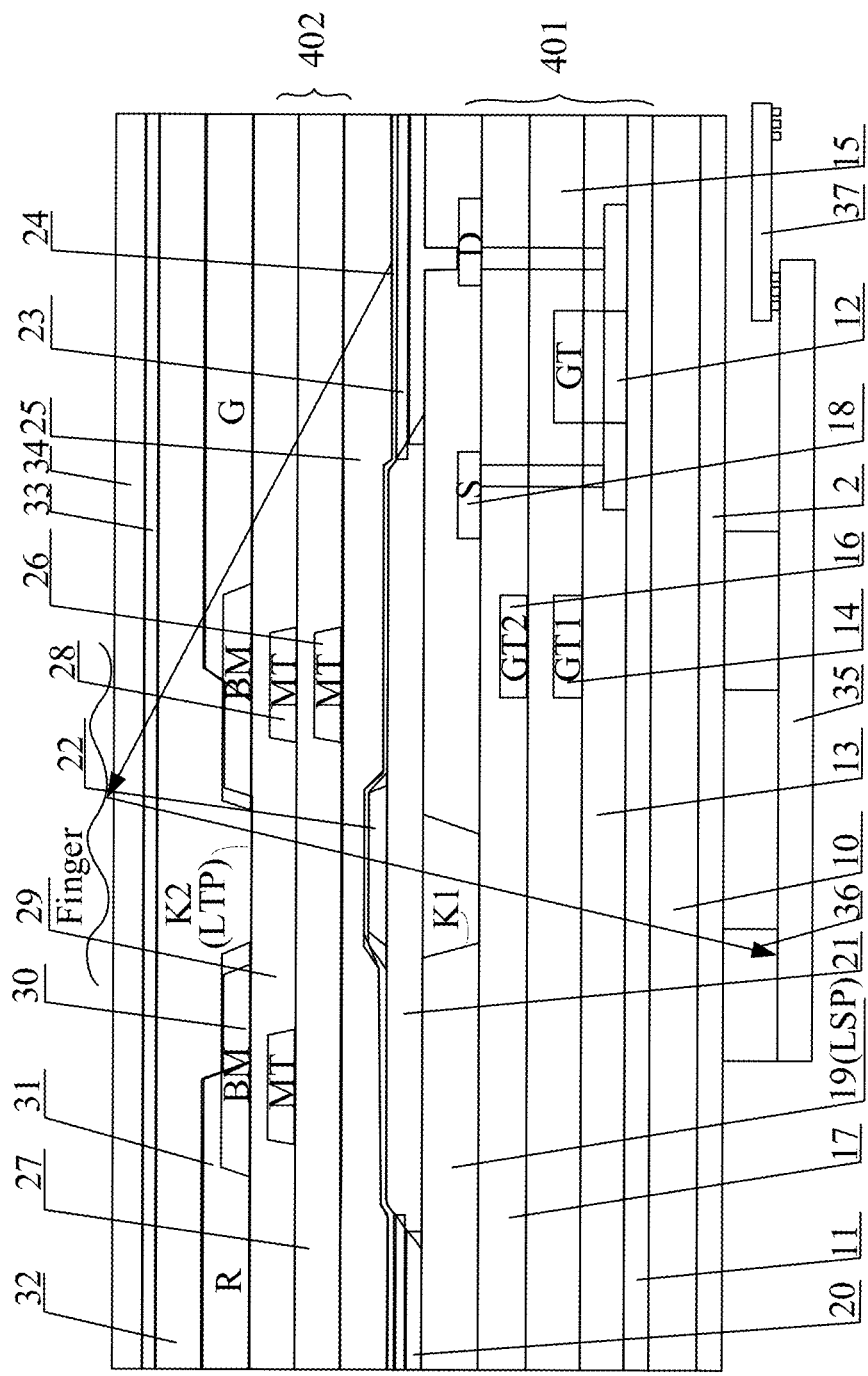
FIG. 2 is a second schematic diagram of a structure of a display panel according to the first embodiment of the present disclosure.

In another exemplary embodiment, as shown in FIG. 2, the material of the first planarization layer 19 is an organic light shield material, and the first planarization layer 19 provided with the first opening K1 forms the light shield part (LSP). A material of the retaining wall in FIG. 2 is an organic light-transmitting material.

Figure 3:
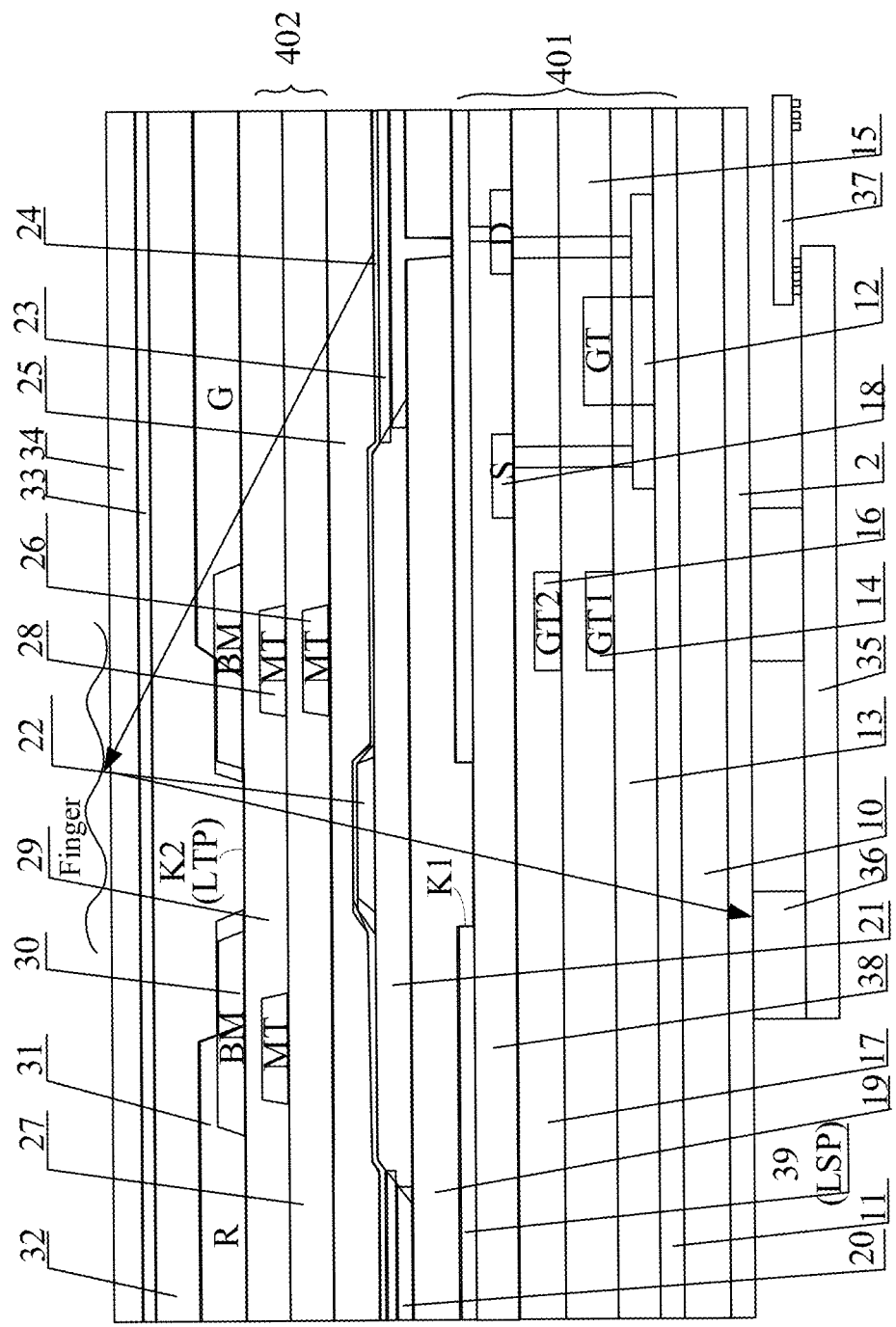
FIG. 3 is a third schematic diagram of a structure of a display panel according to the first embodiment of the present disclosure.

In another exemplary embodiment, as shown in FIG. 3, the drive structure layer 401 includes a buffer layer 11, an active layer 12, a first gate insulating layer 13, a first gate electrode layer 14, a second gate insulating layer 15, a second gate electrode layer 16, a first interlayer insulating layer 17, a first source-drain metal layer 18, a second interlayer insulating layer 38 and a second source-drain metal layer 39 which are sequentially stacked on the base substrate 10, wherein the second source-drain metal layer 39 is provided with the first opening K1 and the second source-drain metal layer 39 forms the first light shield layer.

Figure 4:
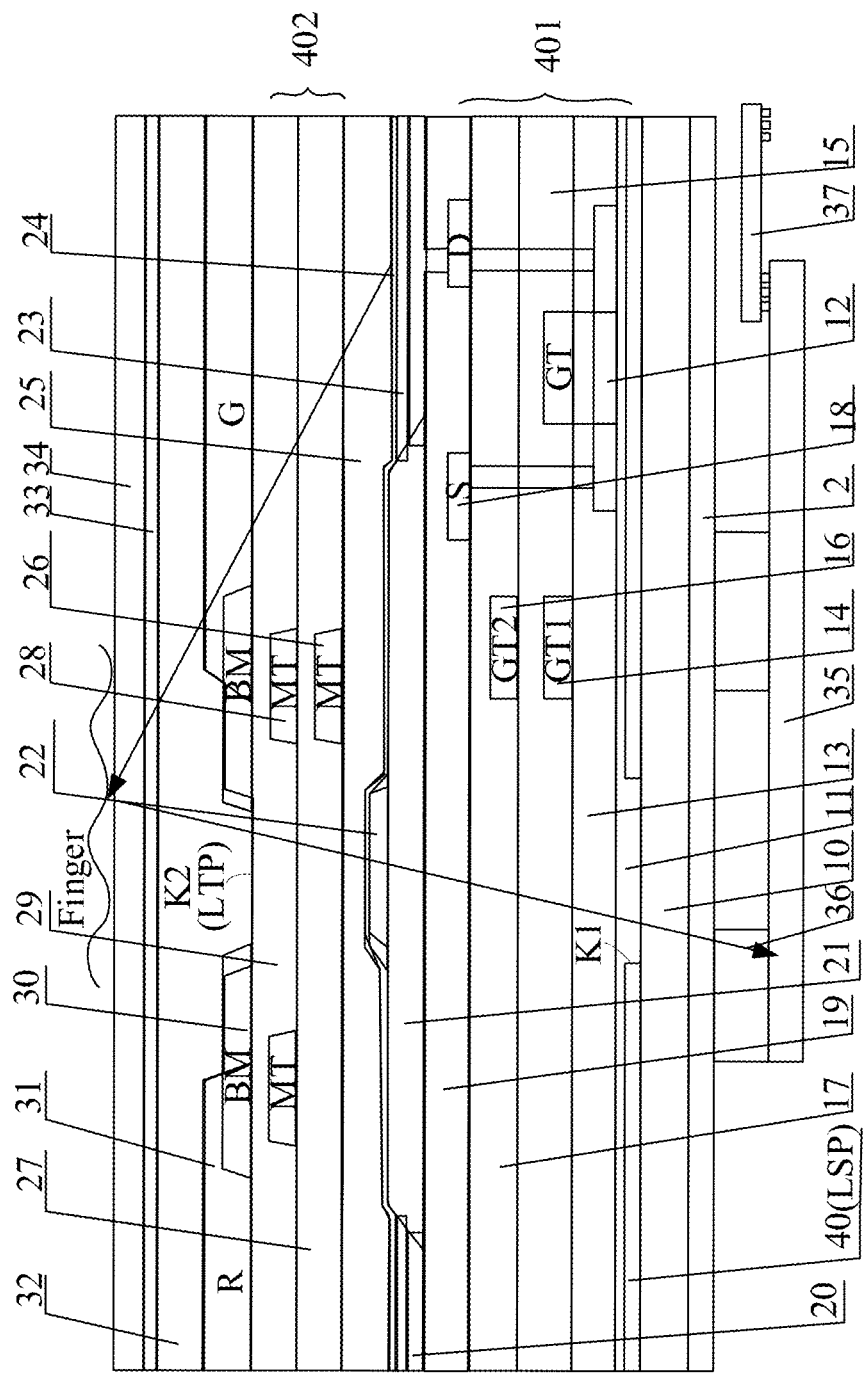
FIG. 4 is a fourth schematic diagram of a structure of a display panel according to the first embodiment of the present disclosure.

In another exemplary embodiment, as shown in FIG. 4, the drive structure layer 401 includes the buffer layer 11, the active layer 12, the first gate insulating layer 13, the first gate electrode layer 14, a second gate insulating layer 15, the second gate electrode layer 16, the first interlayer insulating layer 17 and a first source drain metal layer 18 which are sequentially stacked on a base substrate 10, and a light shield layer 40 disposed between the base substrate 10 and the buffer layer 11 forms the first light shield layer.

Figure 5:
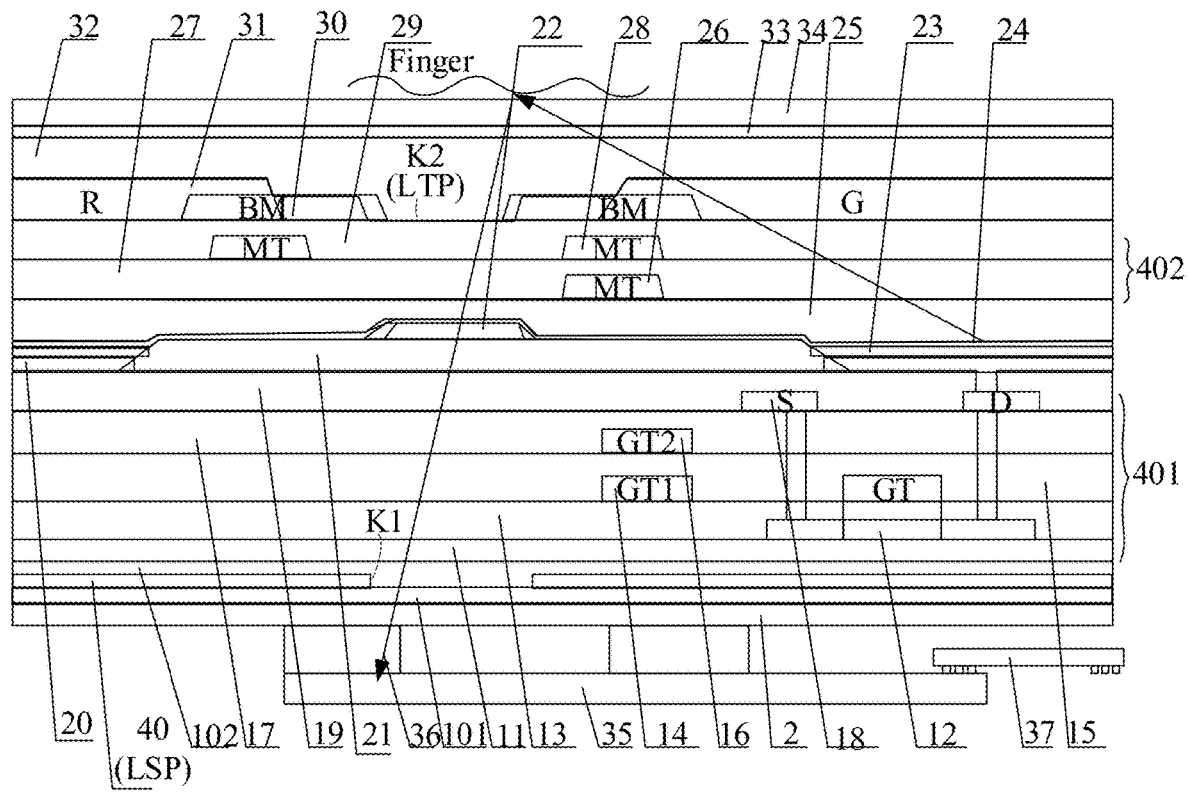
FIG. 5 is a fifth schematic diagram of a structure of a display panel according to the first embodiment of the present disclosure.

In another exemplary embodiment, as shown in FIG. 5, the base substrate 10 includes a first base substrate 101 and a second base substrate 102, and the light shield layer 40 disposed between the first base substrate 101 and the second base substrate 102 forms the first light shield layer.

In the present embodiment, the first light shield layers in FIGS. 3 to 5 are all made of a metal material.

In an exemplary embodiment, as shown in FIGS. 1 to 5, a base film 2 is provided on a surface of the base substrate 10 away from the drive structure layer 401, and the fingerprint identification sensor 35 is attached to a surface of the side of the base film 2 away from the base substrate 10.

In an exemplary embodiment, the fingerprint identification sensor 35 may be a Charge Coupled Device (CCD) image sensor, a Complementary Metal Oxide Semiconductor (CMOS) image sensor, or a Positive Intrinsic Negative (PIN)-type photoelectric sensor manufactured by an amorphous silicon process.

The technical solution of the present embodiment is further described below through a manufacturing process of the display panel in the present embodiment. A "patterning process" mentioned in the embodiment includes processing such as film layer deposition, photoresist coating, mask exposure, development, etching, and photoresist stripping, etc. A "photolithography process" in the present embodiment includes processing such as film layer coating, mask exposure and development, etc. The deposition may be selected as any one or more of sputtering, evaporation and chemical vapor deposition, the coating may be selected as any one or more of spraying and spin coating, and the etching may be selected as any one or more of dry etching and wet etching. A "thin film" refers to a layer of thin film manufactured from a certain material on a base substrate by using a deposition or coating process. If the "thin film" does not need a patterning process during the entire manufacturing process, the "thin film" may also be called a "layer". When the "thin film" needs a patterning process during the entire manufacturing process, it is called a "thin film" before the patterning process and called a "layer" after the patterning process. The "layer" after the patterning process includes at least one "pattern". In the present disclosure, "A and B are disposed on the same layer" means that A and B are formed at the same time by the same patterning process. "An orthographic projection of A includes an orthographic projection of B" means that the orthographic projection of B falls within a range of the orthographic projection of A, or the orthographic projection of A covers the orthographic projection of B.

Figure 6:
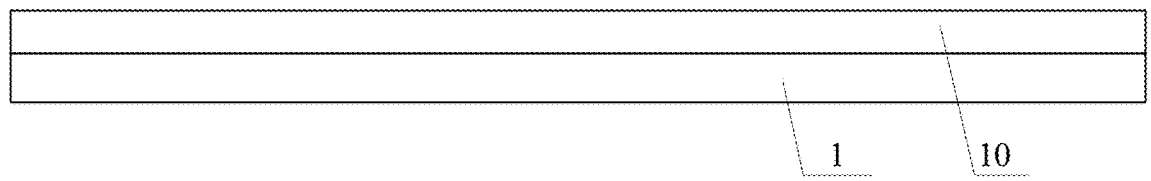
FIG. 6 is a schematic diagram after a pattern of a flexible base substrate is manufactured according to an embodiment of the present disclosure.

A flexible base substrate 10 is manufactured on a glass carrier plate 1. In the present disclosure, a material of the flexible base substrate 10 may be polyimide (PI), polyethylene terephthalate (PET) or a surface-treated polymer soft film, etc., which is as shown in FIG. 6.

A pattern of a drive structure layer 401 is manufactured on the flexible base substrate 10. The drive structure layer 401 includes multiple gate lines and multiple data lines, and the multiple gate lines and the multiple data lines vertically intersect with each other to define multiple pixel units disposed in a matrix, each pixel unit includes at least three sub-pixels, and each sub-pixel includes at least one first Thin Film Transistor (TFT). The first thin film transistor may have a bottom gate structure or a top gate structure, or may be an amorphous silicon (a-Si) thin film transistor, a low temperature polysilicon (LTPS) thin film transistor or an oxide thin film transistor, which is not specifically limited here. In the present embodiment, one pixel unit includes three sub-pixels, namely red sub-pixel R, green sub-pixel G and blue sub-pixel B. Indeed, the present embodiment is also applicable to a case where one pixel unit includes four sub-pixels (red sub-pixel R, green sub-pixel G, blue sub-pixel B and white sub-pixel W). In an exemplary embodiment, the manufacturing process of the drive structure layer 401 may include:

A first insulating thin film and an active layer thin film are sequentially deposited on the flexible base substrate 10, the active layer thin film is patterned by a patterning process to form a first insulating layer 11 covering the entire flexible base substrate 10 and a pattern of an active layer 12 disposed on the first insulating layer 11. In an exemplary embodiment, the first insulating layer 11 is called a buffer layer, which is used for improving the water and oxygen resistance of the base substrate.

Then, a second insulating thin film and a first metal thin film are sequentially deposited, and the first metal thin film is patterned by a patterning process to form a second insulating layer 13 covering a pattern of the active layer pattern 12 and to form a pattern of a first gate electrode layer 14 disposed on the second insulating layer 13, wherein the first gate electrode layer 14 at least includes a first gate electrode (GT) a first capacitor electrode (GT1), multiple gate lines (not shown) and multiple gate leads (not shown). In an exemplary embodiment, the second insulating layer 13 is called a first gate insulating layer (GI1).

Then, a third insulating thin film and a second metal thin film are sequentially deposited, and the second metal thin film is patterned by a patterning process to form a third insulating layer 15 covering the first gate electrode layer 14 and to form a pattern of a second gate electrode layer 16 disposed on the third insulating layer 15, wherein the second gate electrode layer 16 includes at least a second capacitor electrode (GT2) and a second leads (not shown), wherein a position of the second capacitor electrode (GT2) corresponds to that of the first capacitor electrode (GT1). In an exemplary embodiment, the third insulating layer 15 is also called a second gate insulating layer (GI2).

Then, a fourth insulating thin film is deposited and patterned by a patterning process to form a pattern of a fourth insulating layer 17 covering the second gate electrode layer 16, wherein the fourth insulating layer 17 is provided thereon with multiple first via holes, and positions of the multiple first via holes correspond to that of both ends of a first active layer. The fourth insulating layer 17, the third insulating layer 15 and the second insulating layer 13 in the multiple first via holes are etched off to respectively expose a surface of the first active layer. In an exemplary embodiment, the fourth insulating layer 17 is also called a first interlayer insulating layer (ILD).

Then, a third metal thin film is deposited and patterned by the patterning process to form a pattern of a source-drain metal layer 18 on the fourth insulating layer 17, and the source-drain metal layer 18 at least includes a first source electrode S, a first drain electrode D, low voltage line (VSS, not shown), pattern of multiple data lines (not shown), and pattern of multiple data leads (not shown), wherein the first source electrode S and the first drain electrode D are connected to the active layer 12 respectively through the first via holes. In an exemplary embodiment, according to actual needs, the source-drain metal layer 18 may also include any one or more of a power supply line (VDD), a compensation line and an auxiliary second electrode, and the source-drain metal layer 18 is also called a first source-drain metal layer (SD1).

Figure 7:
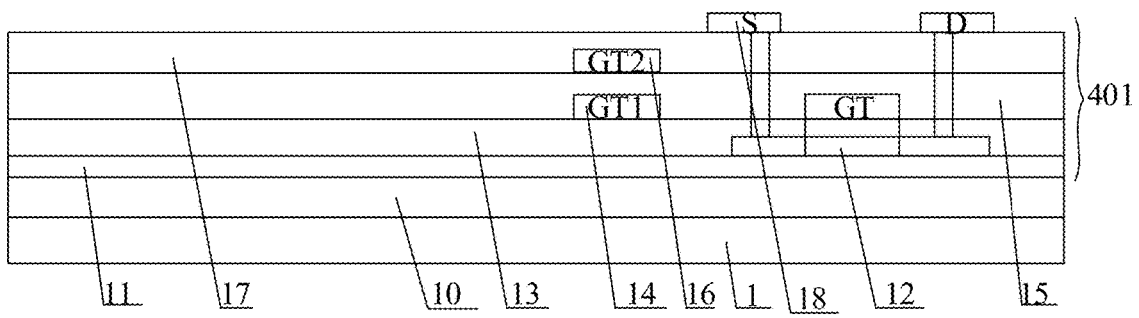
FIG. 7 is a schematic diagram after a pattern of a drive structure layer is manufactured according to an embodiment of the present disclosure.

At this point, the pattern of the drive structure layer 401 is manufactured on the flexible base substrate 10, as shown in FIG. 7. The active layer 12, the first gate electrode GT, the first source electrode S and the first drain electrode D form the first thin film transistor, the first capacitor electrode GT1 and the second capacitor electrode GT2 constitute a first storage capacitor, and multiple gate leads and data leads form drive leads of gate driver on array (GOA).

Figure 8:
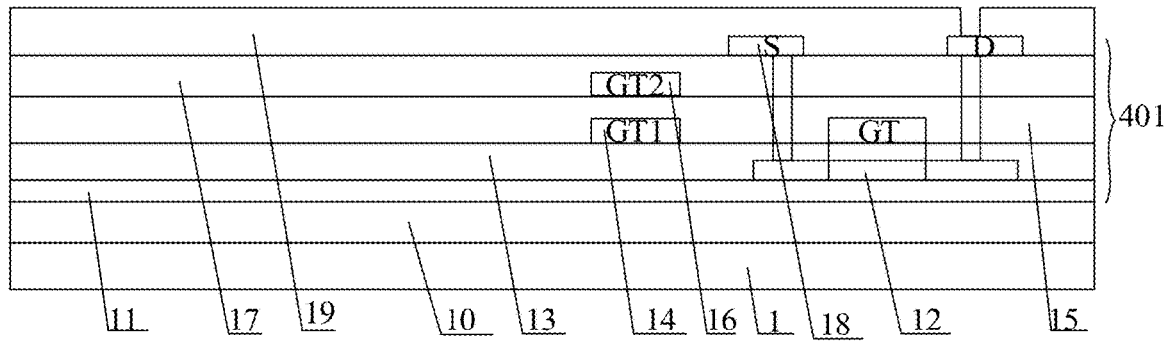
FIG. 8 is a schematic diagram after a pattern of a first planarization layer is formed according to an embodiment of the present disclosure.

A first planarization thin film is coated on the flexible base substrate where the above patterns are formed to form a first planarization (PLN) layer 19 covering the entire flexible base substrate 10, a second via hole is formed on the first planarization layer 19 through a patterning process, wherein the first planarization layer 19 in the second via hole is etched off to expose a surface of the first drain electrode of the first thin film transistor, as shown in FIG. 8.

Figure 9:
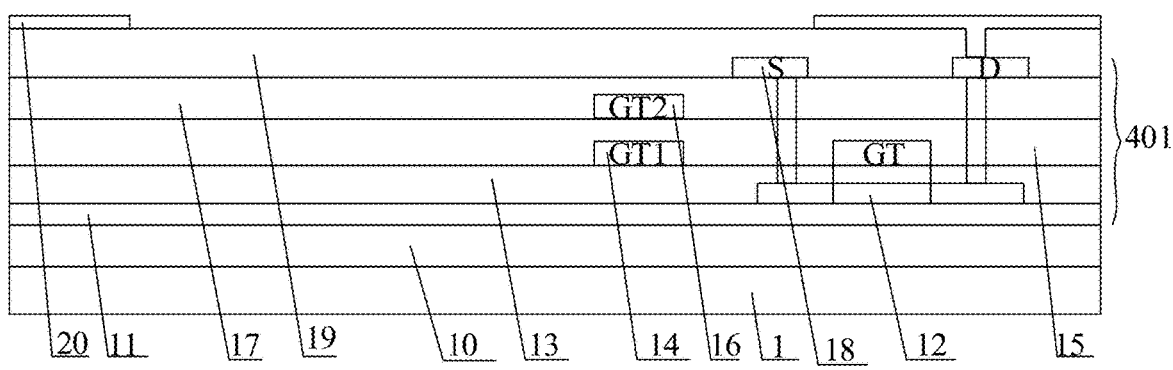
FIG. 9 is a schematic diagram after a pattern of a first electrode is formed according to an embodiment of the present disclosure.

A transparent conductive thin film is deposited on the base substrate where the above patterns are formed, and the transparent conductive thin film is patterned through a patterning process to form a pattern of a first electrode 20, wherein the first electrode 20 is connected to the first drain electrode D through the second via hole. Forming the pattern of the first electrode 20 includes depositing a fourth metal thin film on the base substrate where the above patterns are formed, coating a layer of photoresist on the fourth metal thin film, exposing the photoresist with a single tone mask, forming an unexposed area at the position of the first electrode 20, forming fully exposed areas at other positions, developing and removing the photoresist in the fully exposed areas, etching off the fourth metal film in the fully exposed areas, and stripping off the photoresist to form the pattern of the first electrode 20, as shown in FIG. 9. Since the display panel of the present embodiment has a top emission structure, the first electrode 20 is a reflective electrode, and metals with high reflectivity, such as silver Ag, gold Au, palladium Pd, platinum Pt, etc., or alloys of these metals, or composite layers of these metals may be used. In practice, a composite layer structure of indium tin oxide (ITO) layer and metal reflective layer may also be used, which has good conductivity, high reflectivity and good morphological stability.

Figure 10:
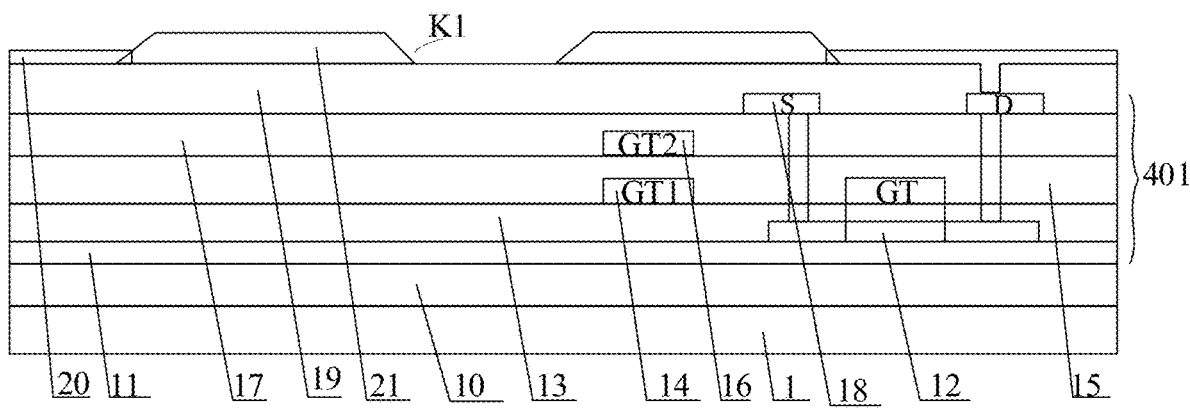
FIG. 10 is a schematic diagram after a pattern of a pixel define layer is formed according to an embodiment of the present disclosure.

A pixel define thin film is coated on the base substrate where the above patterns are formed, and a pattern of a pixel define layer (PDL) 21 is formed through masking, exposure and development processes, wherein the pixel define layer 21 is provided thereon with pixel openings, and the pixel define thin film in the pixel openings is developed away to expose a surface of the first electrode 20. The pixel define layer 21 is provided with a first opening K1, and the pixel define thin film in the first opening K1 is developed to expose a surface of the first planarization layer 19, as shown in FIG. 10.

Figure 11:
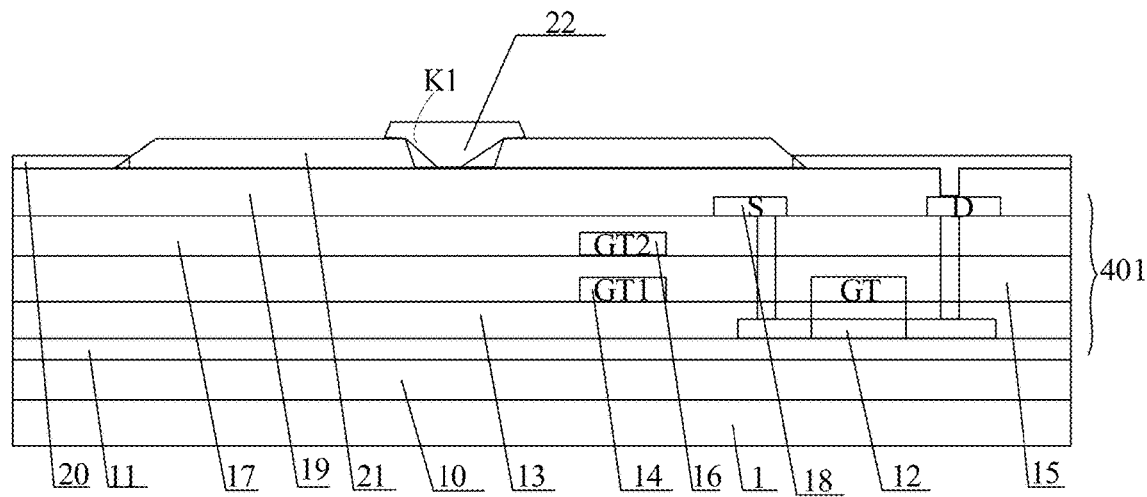
FIG. 11 is a schematic diagram after a pattern of a spacer layer is formed according to an embodiment of the present disclosure.

An organic material thin film is coated on the base substrate where the above patterns are formed, and a pattern of a spacer (PS) layer 22 is formed through masking, exposure and development processes, wherein the spacer layer 22 is disposed at the position of the first opening K1, as shown in FIG. 11.

Figure 12:
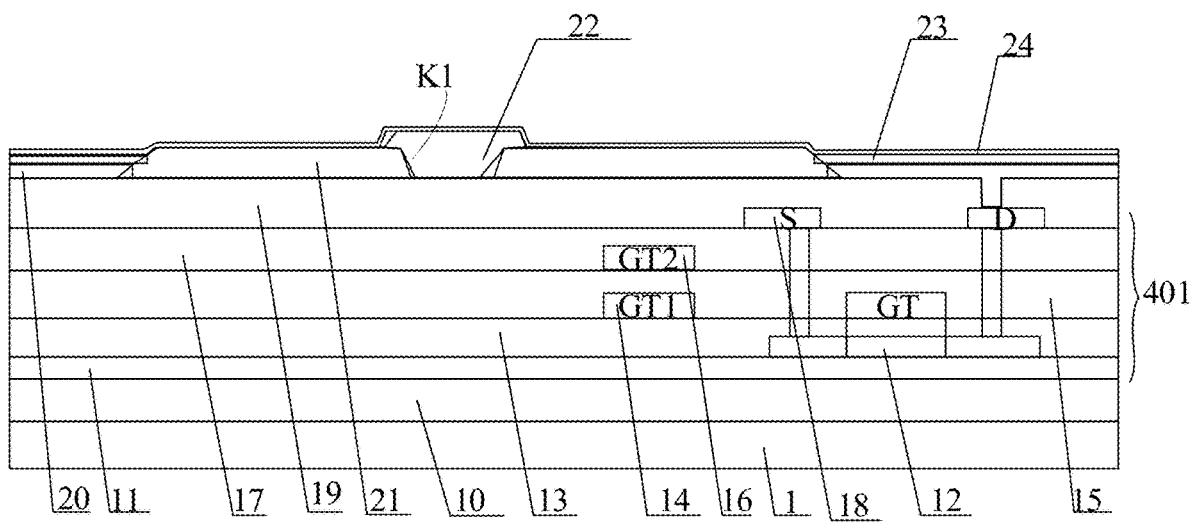
FIG. 12 is a schematic diagram after a pattern of a second electrode is formed according to an embodiment of the present disclosure.

An organic light emitting layer 23 and a second electrode 24 are sequentially formed on the base substrate where the above patterns are formed, as shown in FIG. 12. The organic light emitting layer 23 includes a hole injection layer, a hole transmission layer, a light emitting layer, an electron transmission layer and an electron injection layer which are stacked, and is formed in the pixel opening to achieve a connection between the organic light emitting layer 23 and the first electrode 20. Since the first electrode 20 is connected to a first drain electrode D of the first transistor, light emission control of the organic light emitting layer 23 is achieved. The second electrode 24 is connected to the organic light emitting layer 23.

Figure 13:
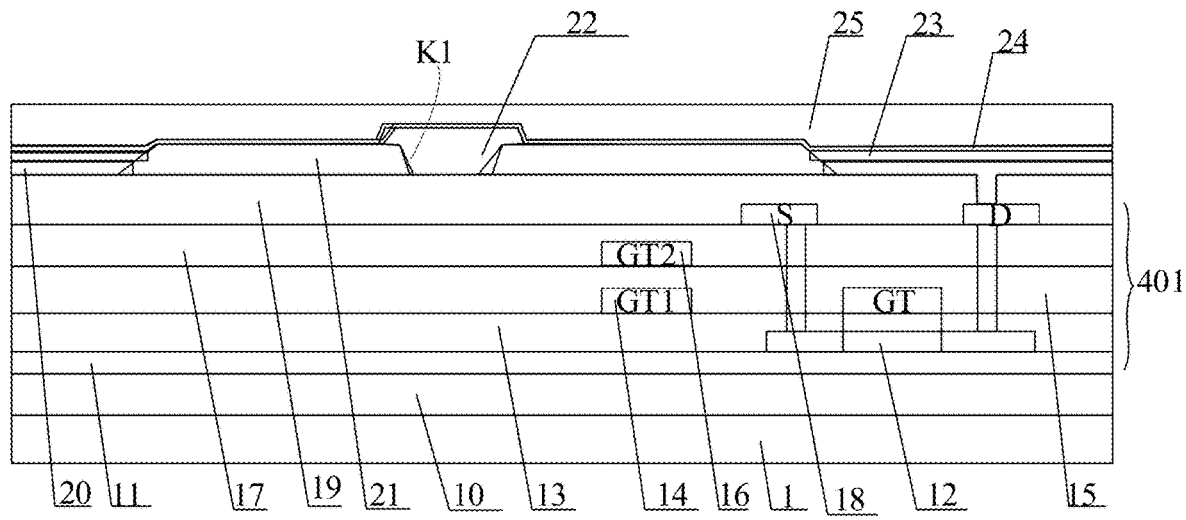
FIG. 13 is a schematic diagram after a pattern of an encapsulation layer is formed according to an embodiment of the present disclosure.

A pattern of an encapsulation layer 25 is formed on the base substrate where the above patterns are formed, as shown in FIG. 13, the encapsulation layer 25 may adopt a laminated structure of inorganic material/organic material/inorganic material, wherein the organic material layer is disposed between two inorganic material layers.

Figure 14:
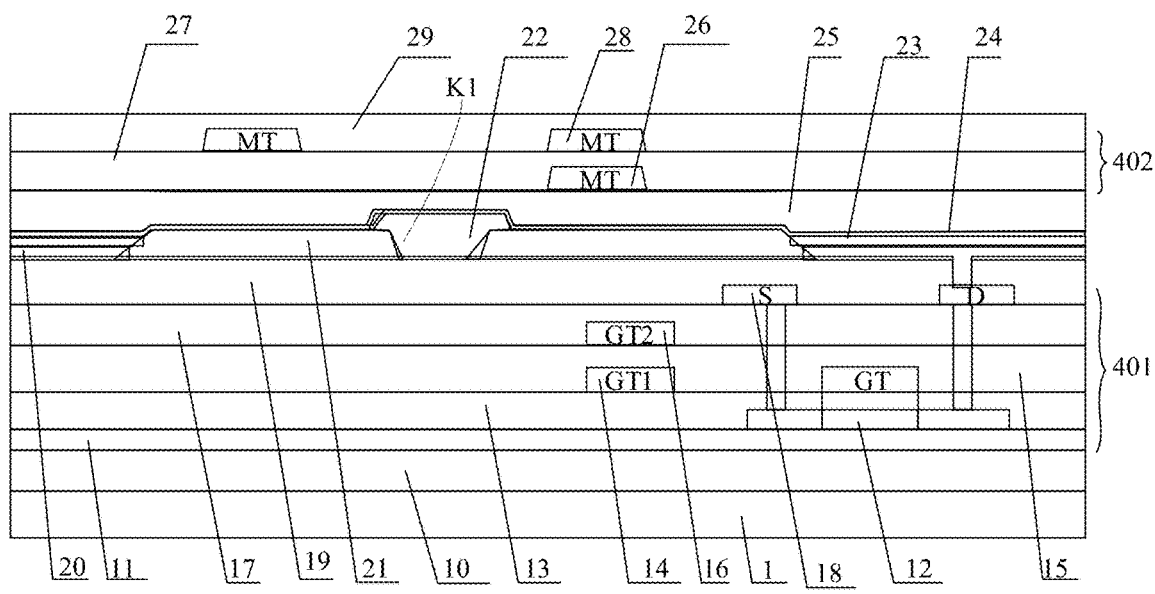
FIG. 14 is a schematic diagram after a pattern of a touch structure layer is formed according to an embodiment of the present disclosure.

A pattern of a touch structure layer 402 is formed on the base substrate where the above patterns are formed, and the touch structure layer 402 includes a first touch electrode layer 26, a fifth insulating layer 27, a second touch electrode layer 28 and a sixth insulating layer 29 stacked on the encapsulation layer 25, as shown in FIG. 14.

Figure 15:
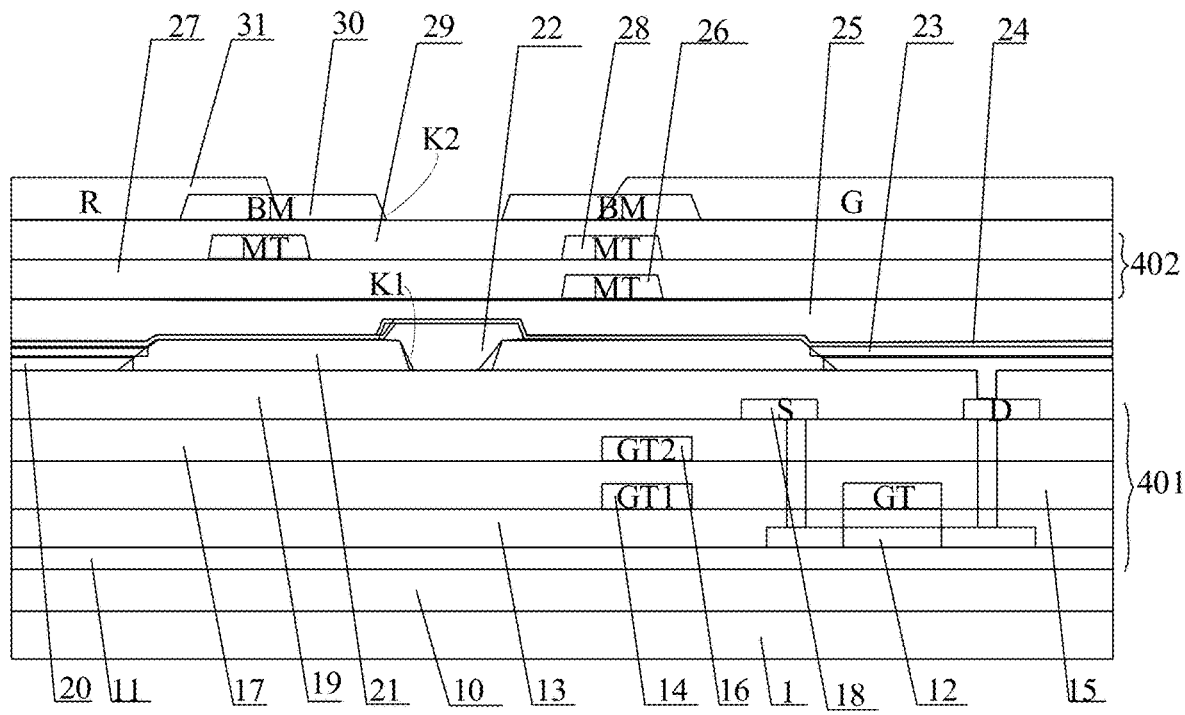
FIG. 15 is a schematic diagram after a pattern of a color film layer is formed according to an embodiment of the present disclosure.

A pattern of a color film layer is formed on the base substrate where the above patterns are formed, wherein the color film layer is disposed on the sixth insulating layer 29 and includes a first black matrix 30 and a color filter 31 disposed on a same layer, as shown in FIG. 15. Forming the pattern of the color filter layer includes: firstly, coating a polymer photoresist layer mixed with black matrix material on the sixth insulating layer 29 to form a pattern of the first black matrix 30 through exposure and development; then, coating a polymer photoresist layer mixed with red pigment on the sixth insulating layer 29 to form a pattern of a red area through exposure and development; sequentially forming a pattern of a green area and a pattern of a blue area using the same methods and steps; and finally, forming color filters 31 with red, green and blue which are arranged according to a certain rule. The second opening K2 is disposed on the first black matrix 30 between the color filters 31 with different colors, and the second opening K2 exposes a surface of the sixth insulating layer 29.

Figure 16:
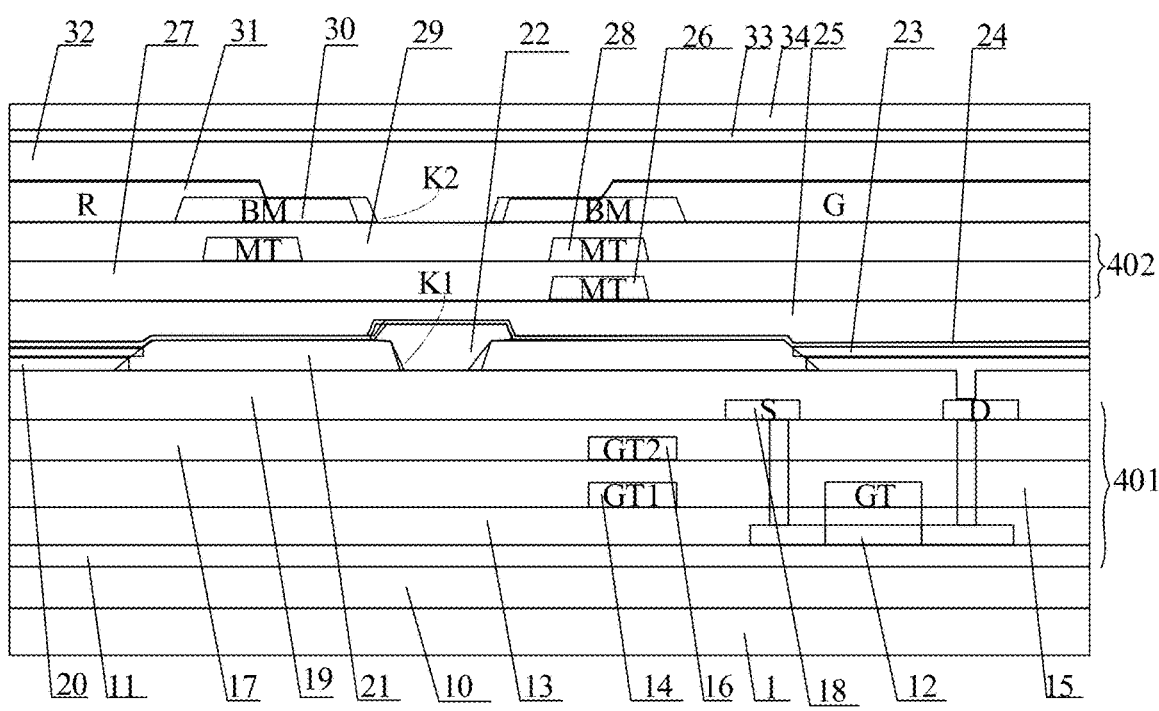
FIG. 16 is a schematic diagram after a cover plate is attached according to an embodiment of the present disclosure.

A thin film encapsulation process is performed on the base substrate where the above patterns are formed to form a pattern of a coating protective layer 32, an optical adhesive 33 is coated on the base substrate where the pattern of the coating protective layer 32 is formed, and a cover plate 34 is attached to the optical adhesive 33, as shown in FIG. 16.

After the above film structure is manufactured, a display substrate is peeled off from a glass carrier plate 1 by peeling process, and then a base film 2 is attached to the back of the display substrate (a surface of the flexible base substrate 10 away from the film layer) by roller bonding, and a fingerprint identification sensor 35 is attached to a surface of the base film 2 away from the flexible base substrate 10, the fingerprint identification sensor 35 is attached to the surface of the base film 2 on the side away from the flexible base substrate 10 through a foam layer 36 and the fingerprint identification sensor 35 is connected to a flexible printed circuit (FPC) 37, as shown in FIG. 1.

Through the above process, the manufacturing of the display panel shown in FIG. 1 in the present embodiment can be completed. It may be seen from the above manufacturing process that the display panel according to the present embodiment blocks out stray light through the light shield part LSP, and allows fingerprint reflected light to transmit and reach the fingerprint identification sensor 35 through the light transmission part LTP and the first opening K1, so that light can pass through the screen for fingerprint identification without increasing power consumption. The manufacturing process is simple and the production efficiency is high with the advantages of low production cost, high yield, etc., which has a great application prospect.

In an embodiment of the present disclosure, the first light shield layer includes a plurality of first openings and each of the plurality of first openings is the first opening described above, and the first openings are arranged at intervals, and a distance between two adjacent first openings ranges from 20 μm to 800 μm.

In an embodiment of the present disclosure, a distance between an edge of the orthographic projection of the touch electrodes and an edge of the orthographic projection of the first opening on the base substrate is between 0 μm and 20 μm.

Although the display panel of the present embodiment is described with a top emission structure, the solution of the present embodiment is applicable to a bottom emission structure or a double-sided emission structure, and is also applicable to large-sized or small-sized display panels. As shown in FIG. 1, the display panel manufactured by the above manufacturing process includes:

a base substrate 10;
a drive structure layer 401 disposed on the base substrate 10, wherein the drive structure layer 401 in each sub-pixel includes a first thin film transistor;
a first planarization layer 19 disposed on the drive structure layer 401;
a light emitting structure layer disposed on the first planarization layer 19, the light emitting structure layer in each sub-pixel includes a first electrode 20, a pixel define layer 21, a spacer layer 22, an organic light emitting layer 23 and a second electrode 24, wherein the first electrode 20 is disposed on the first planarization layer 19 and connected to the first thin film transistor in the drive structure layer 401 through a via hole provided on the first planarization layer 19, and the pixel define layer 21 is disposed on the first planarization layer 19 and includes multiple pixel openings and retaining walls around the pixel openings, wherein the pixel openings expose the first electrode 20, a material of the retaining walls is an organic light shield material, and first openings K1 are provided on the retaining walls; the spacer layer 22 is disposed on the pixel define layer 21; the organic light emitting layer 23 is disposed on the first electrode 20; the second electrode 24 is disposed on the organic light emitting layer 23;
an encapsulation layer 25 disposed on the second electrode 24 and covering the entire base substrate 10;

a touch structure layer 402 including a first touch electrode layer 26, a fifth insulating layer 27, a second touch electrode layer 28 and a sixth insulating layer 29 which are stacked on the encapsulation layer 25;

a color film layer disposed on the sixth insulating layer 29, including a black matrix 30 and color filters 31 disposed on a same layer, wherein the second opening K2 is disposed on the black matrix 30 between the color filters 31 with different colors, and the second opening K2 expose a surface of the sixth insulating layer 29;

a coating protective layer 32 disposed on the color film layer for protecting the color film layer;

a cover plate 34 attached to the coating protective layer 32 by an optical adhesive 33;

a base film 2 disposed on a surface of the base substrate 10 away from the drive structure layer 401; and the fingerprint identification sensor 35 attached to a surface of the base film 2 away from the base substrate 10.

In an embodiment of the present disclosure, there is no overlapping between an orthographic projection of the touch electrodes on the base substrate and an orthographic projection of the first opening on the base substrate; and there is no overlapping between the orthographic projection of the touch electrodes on the base substrate and an orthographic projection of the second opening on the base substrate.

In an embodiment of the present disclosure, a distance between the cover plate and the second opening in a direction perpendicular to the display panel is greater than a distance between the second opening and the sensor area in the direction perpendicular to the display panel; an aperture of the second opening is smaller than or equal to an aperture of the first opening.

The manufacturing process of the display panel shown in FIG. 2 to FIG. 5 is similar to this, and thus the repeated contents will not be described in the present disclosure.

Figure 17:
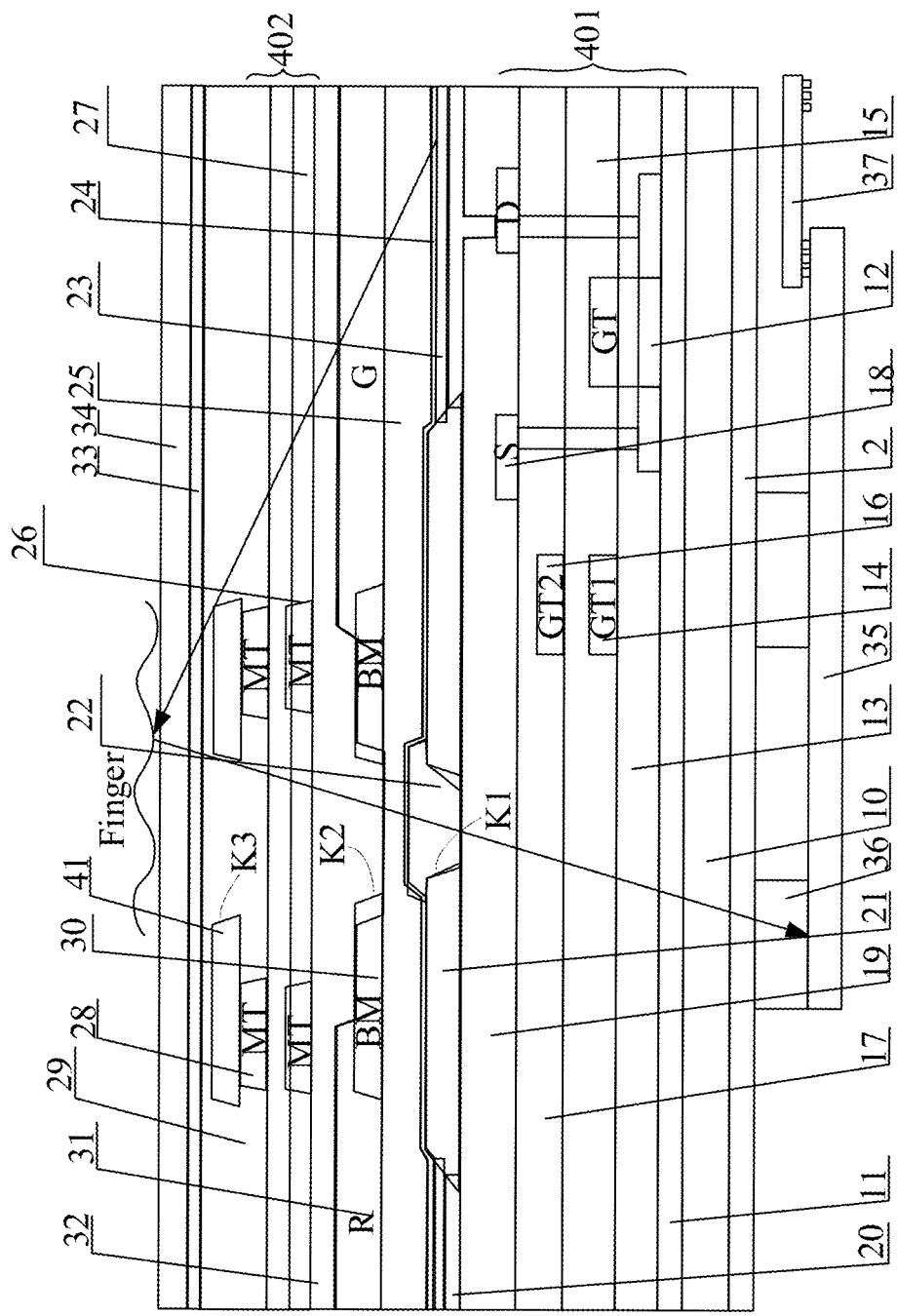
FIG. 17 is a schematic diagram of a structure of a display panel according to another embodiment of the present disclosure.

In another embodiment of the present disclosure, the present embodiment is an extension of the aforementioned embodiments. In the aforementioned embodiments, the touch structure layer 402 in FIGS. 1 to 5 is disposed between the encapsulation layer 25 and the color film layers, and in the present embodiment, the touch structure layer 402 is disposed above the color film layers. As shown in FIG. 17, the display panel provided in the present embodiment includes multiple pixel units disposed in a matrix, and each pixel unit includes multiple sub-pixels, for example, each pixel unit may include three sub-pixels, namely red sub-pixel R, green sub-pixel G and blue sub-pixel B. In the present embodiment, the display panel is provided with a second black matrix layer on the touch structure layer 402, wherein the second black matrix layer includes multiple second black matrices 41 with third openings K3. An orthographic projection of the second black matrices 41 on the base substrate 10 covers an orthographic projection of touch electrodes on the base substrate 10, and the stray light caused by the reflection of the touch electrodes is eliminated by the second black matrices 41.

As shown in FIG. 17, the display panel of the present embodiment includes the base substrate 10 and multiple pixel units disposed in a matrix on the base substrate 10. Each pixel unit includes multiple sub-pixels, and each sub-pixel includes a drive structure layer 401, a first planarization layer 19, a first electrode 20, a pixel define layer 21, a spacer layer 22, an organic light emitting layer 23, a second electrode 24, an encapsulation layer 25, a color film layer and a coating protective layer 32.

Herein, the drive structure layer 401 is disposed on the base substrate 10 and the drive structure layer 401 in each sub-pixel includes a first thin film transistor. The first planarization layer 19 is disposed on the drive structure layer 401. The first electrode 20 is disposed on the first planarization layer 19 and connected to the first thin film transistor in the drive structure layer 401 through a via hole provided on the first planarization layer 19. The pixel define layer 21 is disposed on the first planarization layer 19 and includes multiple pixel openings and retaining wall around the pixel openings, wherein the pixel openings expose the first electrodes 20. The spacer layer 22 is disposed on the pixel define layer 21. The organic light emitting layer 23 is disposed on the first electrode 20. The second electrode 24 is disposed on the organic light emitting layer 23; the encapsulation layer 25 is disposed on the second electrode 24 and covers the entire base substrate 10. The color film layer is disposed on the encapsulation layer 25. The coating protective layer 32 is disposed on the color film layer.

As shown in FIG. 17, the display panel of the present embodiment further includes a touch structure layer 402 and the second black matrix layer sequentially stacked on the coating protective layer 32, among them:

the touch structure layer 402 includes multiple touch electrodes;

the second black matrix layer includes multiple second black matrices 41 provided with third openings K3. An orthographic projection of the second black matrices 41 on the base substrate 10 covers an orthographic projection of the touch electrodes on the base substrate 10, and there is an overlapping area between an orthographic projection of the third openings K3 on the base substrate 10 and an orthographic projection of the second openings K2 on the base substrate 10.

Similar to the principle of the aforementioned embodiments, the first light shield layer of the present embodiment may be an opaque organic material layer, which may be disposed on the first planarization layer 19 or the pixel define layer 21. Alternatively, the first light shield layer in the present embodiment may also be made of a metal layer, which may be disposed at any one of the following positions: on a second source-drain metal layer 39. between the base substrate 10 and a buffer layer 11, and between a first base substrate 101 and a second base substrate 102.

The present embodiment also achieves the technical effects of the aforementioned embodiments, which include blocking out stray light through the light shield part LSP, allowing fingerprint reflected light to transmit and reach the fingerprint identification sensor 35 through the light transmission part LTP and the first openings K1, enabling light to pass through the screen for fingerprint identification without increasing power consumption, with advantages of simple manufacturing process, high production efficiency, low production cost, high yield, which has a good application prospect; and providing second openings K2 on the first black matrices 30 between the color filters 31 with different colors, pin-hole imaging a fingerprint in contact with the display panel onto the fingerprint identification sensor 35 through the second openings K2.

Figure 18:
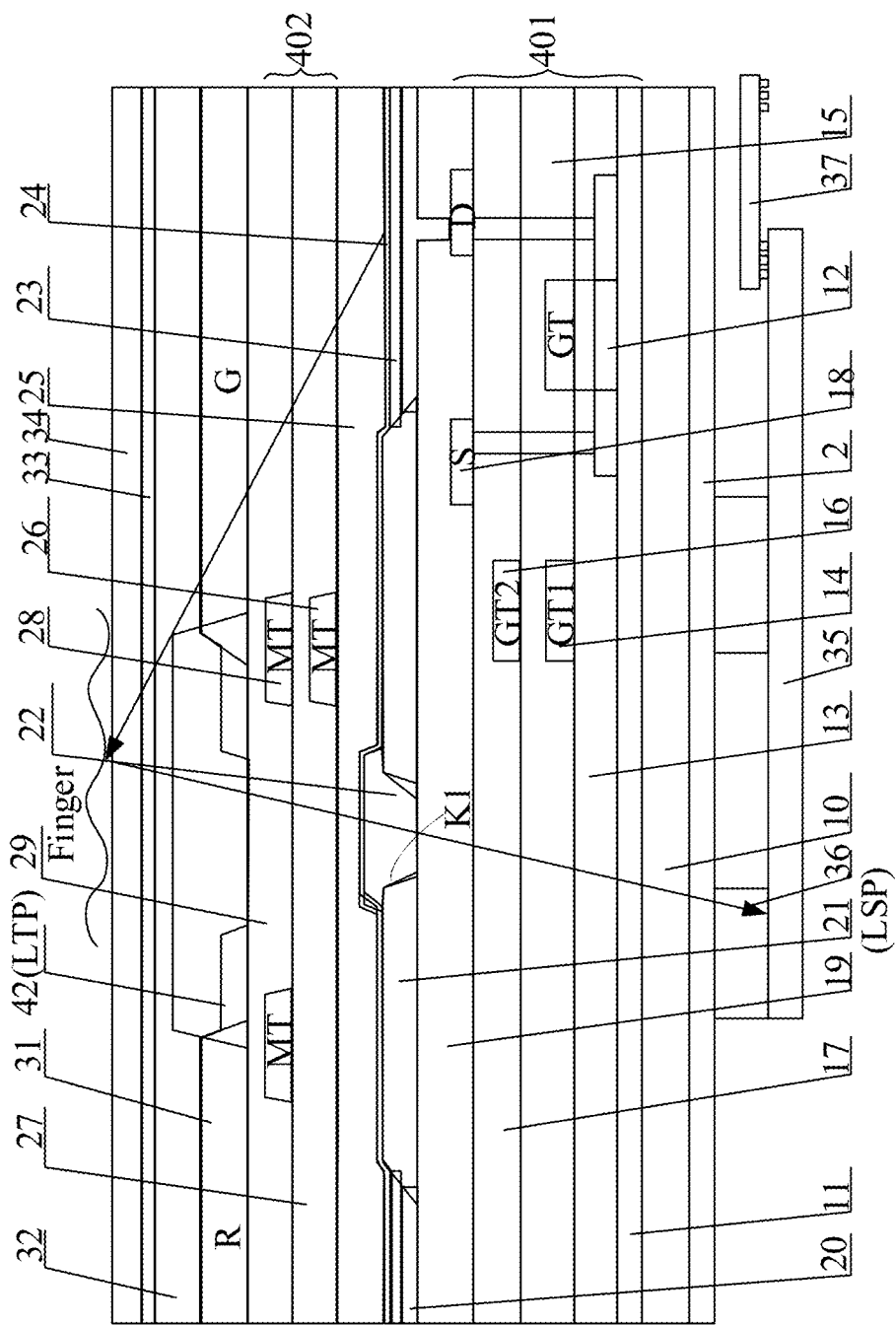
FIG. 18 is a first schematic diagram of a structure of a display panel according to another embodiment of the present disclosure.

In another embodiment of the present disclosure, the present embodiment is an extension of the aforementioned embodiments. The color film layer in the aforementioned embodiments includes a first black matrix 30, and the first black matrix 30 is provided with a second opening K2 which forms the light transmission part LTP. The color film layer in the present embodiment includes a polarizer which forms the light transmission part LTP. As shown in FIG. 18 to FIG.

22, the display panel according to the present embodiment includes multiple pixel units disposed in a matrix, and each pixel unit includes multiple sub-pixels. For example, each pixel unit may include three sub-pixels, namely red sub-pixel R, green sub-pixel G and blue sub-pixel B. The color film layer of the display panel of the present embodiment includes color filters 31 with different colors and a polarizer 42 disposed between the color filters 31 with different colors, wherein the polarizer 42 forms the light transmission part LTP, and a fingerprint in contact with the display panel is pin-hole imaged on a fingerprint identification sensor 35 through the first opening K1.

As shown in FIGS. 18 to 22, the display panel includes a base substrate 10, a drive structure layer 401, a first planarization layer 19, a first electrode 20, a pixel define layer 21, a spacer layer 22, an organic light emitting layer 23, a second electrode 24, an encapsulation layer 25, a touch structure layer 402, a color film layer, a coating protective layer 32 and a cover plate 34 which are disposed on the base substrate 10.

The drive structure layer 401 is disposed on the base substrate 10 and the drive structure layer 401 in each sub-pixel includes a first thin film transistor. The first planarization layer 19 is disposed on the drive structure layer 401. The first electrode 20 is disposed on the first planarization layer 19 and connected to the first thin film transistor in the drive structure layer 401 through a via hole provided on the first planarization layer 19. The pixel define layer 21 is disposed on the first planarization layer 19 and includes multiple pixel openings and retaining walls around the pixel openings, wherein the pixel openings expose the first electrodes 20. The spacer layer 22 is disposed on the pixel define layer 21. The organic light emitting layer 23 is disposed on the first electrode 20. The second electrode 24 is disposed on the organic light emitting layer 23. The encapsulation layer 25 is disposed on the second electrode 24 and covers the entire base substrate 10. The touch structure layer 402 is disposed on the encapsulation layer 25. The color film layer is disposed on the touch structure layer 402. The coating protective layer 32 is disposed on the color film layer. The cover plate 34 is disposed on the coating protective layer 32.

In the present embodiment, the color film layer includes color filters 31 with different colors and a polarizer 42 disposed between the color filters 31 with different colors, wherein the polarizer 42 forms the light transmission part LTP, and the first opening K1 pin-hole images a fingerprint in contact with the display panel onto the fingerprint identification sensor 35.

In an exemplary embodiment, as shown in FIGS. 7 to 11, the display panel further includes a cover plate 34, and a distance between the cover plate 34 and first opening K1 in the direction perpendicular to the display panel is greater than a distance between the first opening K1 and the fingerprint identification sensor 35 in the direction perpendicular to the display panel. Since the distance between the first opening K1 and an outermost side of a screen is an object distance, and the distance between the first opening K1 and the fingerprint identification sensor 35 is an image distance, the imaging area may be increased and the density and number of pinhole arrays may be reduced when the object distance is greater than the image distance.

In an exemplary embodiment, in order to increase the distance between the cover plate 34 and the first opening K1 in the direction perpendicular to the display panel, the cover plate 34 may be made into a multilayer structure. For example, the cover plate 34 may be made into a double-layer structure.

In an exemplary embodiment, a shape of the first opening K1 may be square, circle, polygonal, etc.

In an exemplary embodiment, an aperture of the first opening K1 may be 3 to 30 microns.

A first light shield layer in the present embodiment may be an opaque organic material layer, which may be disposed on a first planarization layer 19 or a pixel define layer 21. Alternatively, the first light shield layer in the present embodiment may also be made of a metal layer, which may be disposed at any one of the following positions: on a second source-drain metal layer 39, between the base substrate 10 and a buffer layer 11, and between a first base substrate 101 and a second base substrate 102.

In an exemplary embodiment, as shown in FIG. 18, the material of a retaining wall is an organic light shield material, and the retaining wall is provided with a first opening K1, and the retaining wall forms the light shield part LSP.

Figure 19:
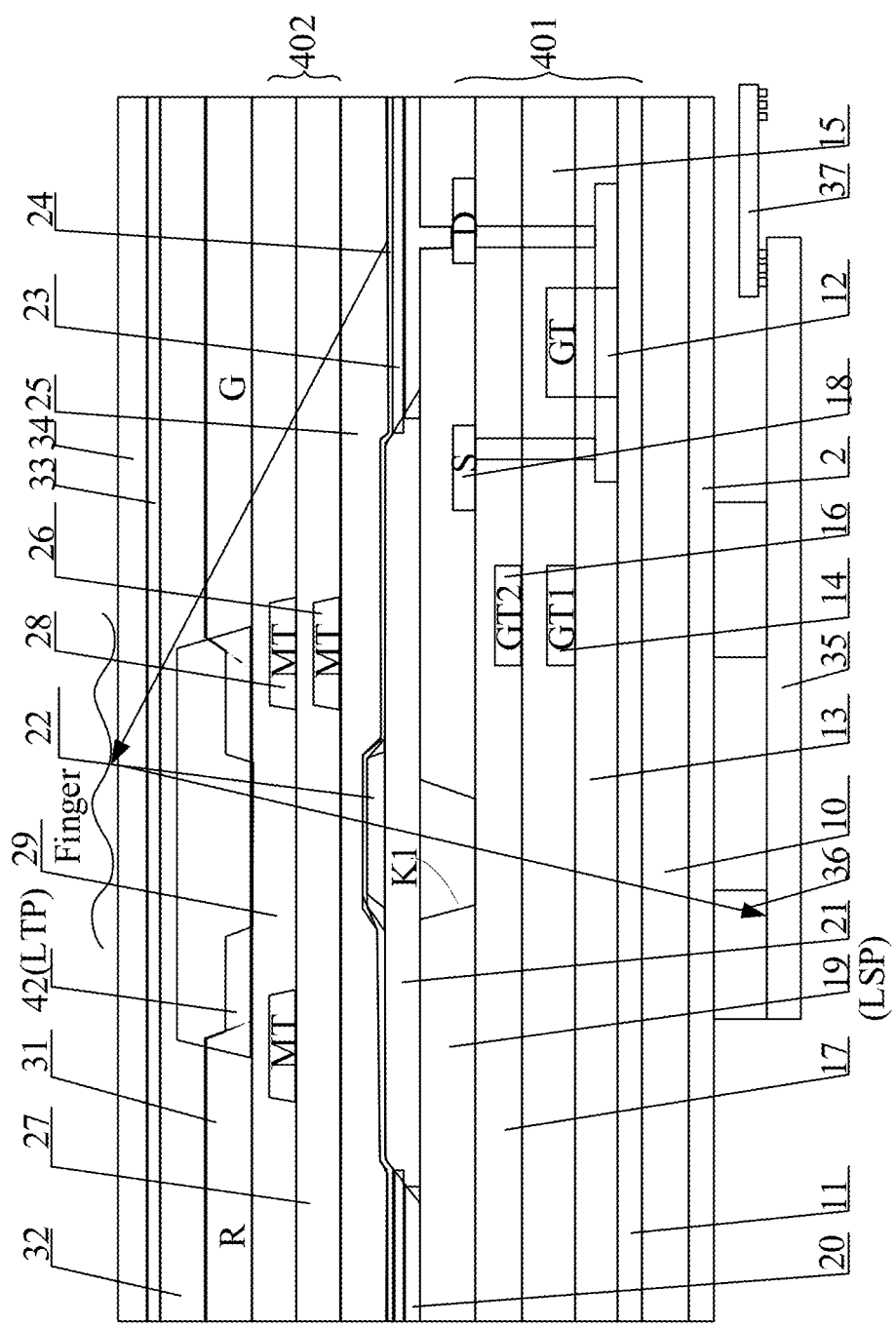
FIG. 19 is a second schematic diagram of a structure of a display panel according to another embodiment of the present disclosure.

In another exemplary embodiment, as shown in FIG. 19, a material of the first planarization layer 19 is an organic light shield material, the first planarization layer 19 is provided thereon with the first opening K1, and the first planarization layer 19 forms the light shield part LSP.

Figure 20:
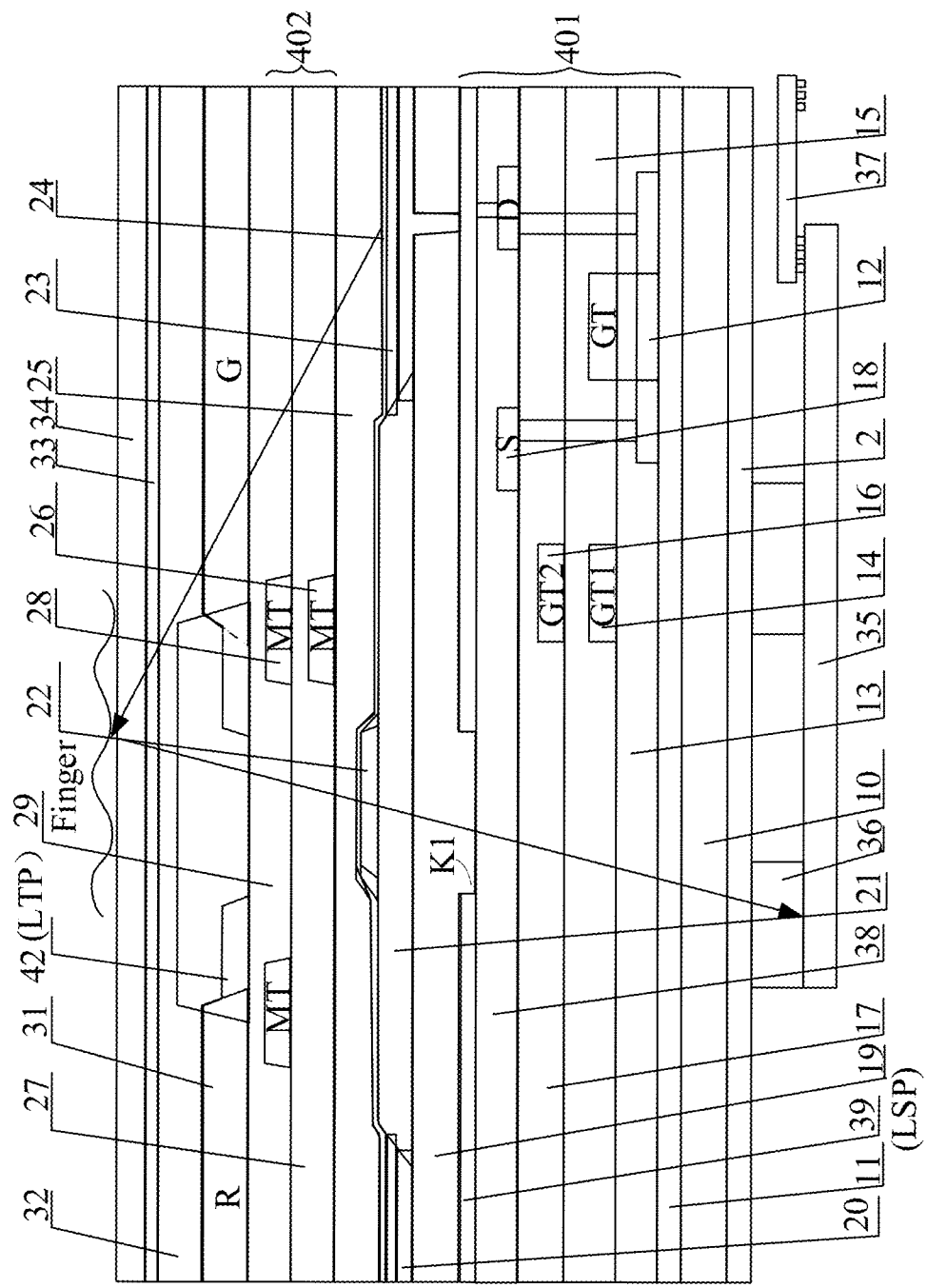
FIG. 20 is a third diagram of a structure of a display panel according to another embodiment of the present disclosure.

In still another exemplary embodiment, as shown in FIG. 20, a drive structure layer 401 includes a buffer layer 11, an active layer 12, a first gate insulating layer 13, a first gate electrode layer 14, a second gate insulating layer 15, a second gate electrode layer 16, a first interlayer insulating layer 17, a first source-drain metal layer 18, a second interlayer insulating layer 38 and a second source-drain metal layer 39 which are sequentially stacked on a base substrate 10, wherein the second source-drain metal layer 39 is provided with a first opening K1 and the second source-drain metal layer 39 forms the first light shield layer.

Figure 21:
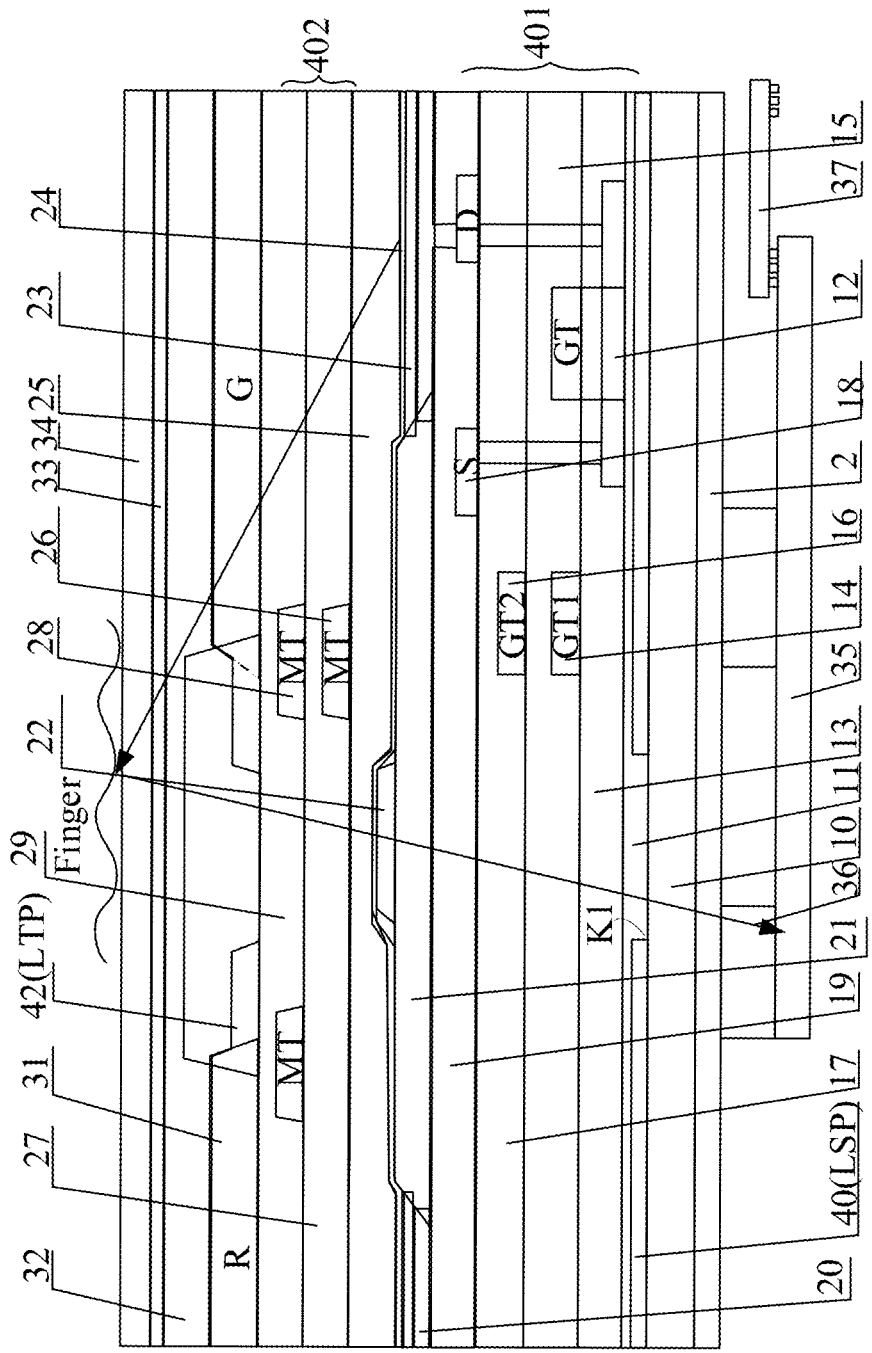
FIG. 21 is a fourth schematic diagram of a structure of a display panel according to another embodiment of the present disclosure.

In still another exemplary embodiment, as shown in FIG. 21, a drive structure layer 401 includes a buffer layer 11, an active layer 12, a first gate insulating layer 13, a first gate electrode layer 14, a second gate insulating layer 15, a second gate electrode layer 16, a first interlayer insulating layer 17 and a first source-drain metal layer 18 which are sequentially stacked on a base substrate 10, and a light shield layer 40 disposed between the base substrate 10 and the buffer layer 11 forms the first light shield layer.

Figure 22:
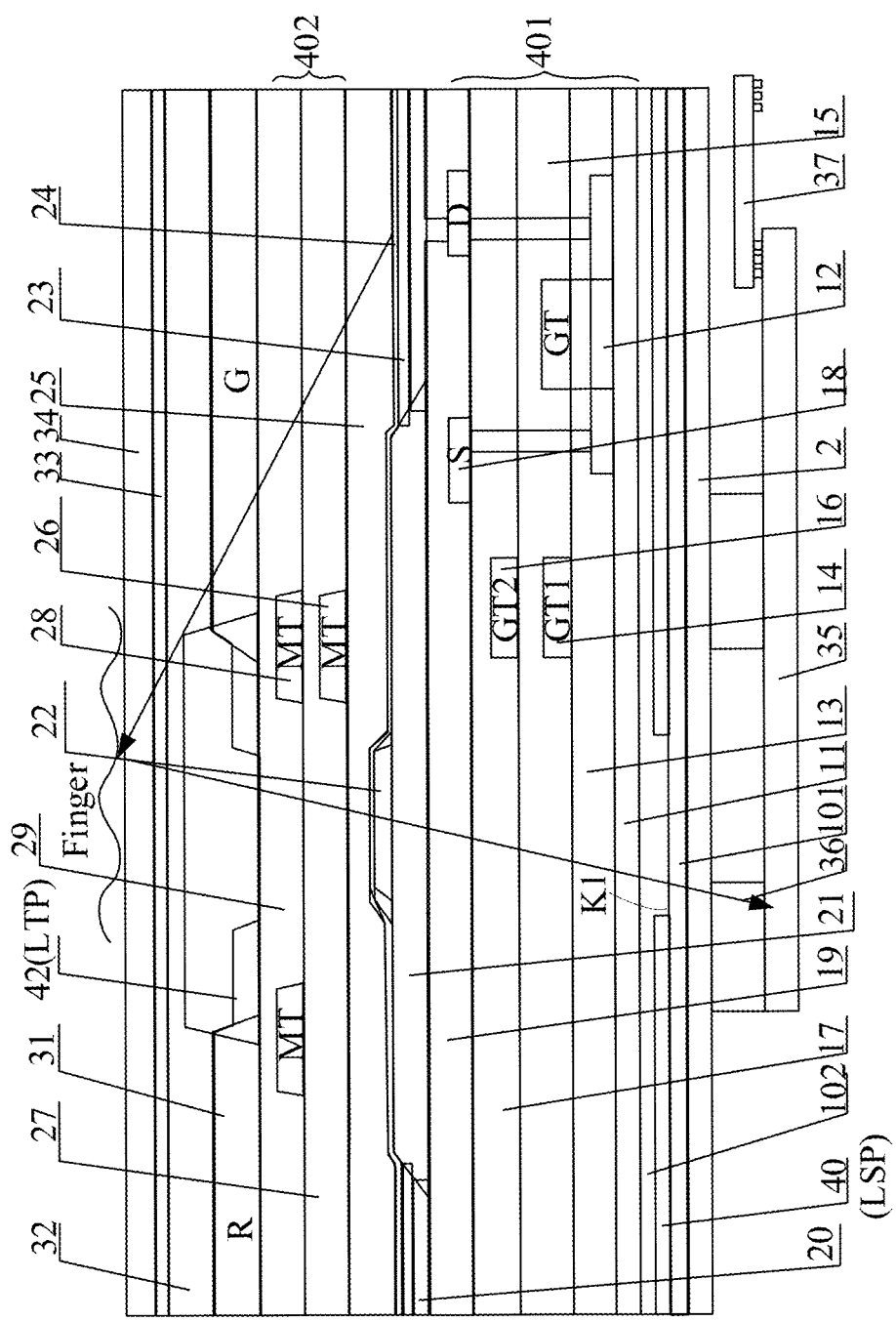
FIG. 22 is a fifth schematic diagram of a structure of a display panel according to another embodiment of the present disclosure.

In still another exemplary embodiment, as shown in FIG. 22, the base substrate 10 includes a first base substrate 101 and a second base substrate 102, and a light shield layer 40 disposed between the first base substrate 101 and the second base substrate 102 forms the first light shield layer.

The present embodiment also achieves the technical effects of the aforementioned embodiments, which include blocking out stray light through the light shield part LSP, allowing fingerprint reflected light to transmit and reach the fingerprint identification sensor 35 through the light transmission part LTP and the first opening K1, and enabling light to pass through the screen for fingerprint identification without increasing power consumption with advantages of simple manufacturing process, high production efficiency, low production cost and high yield, etc, which has a great application prospect. Meanwhile, in the present embodiment, a polarizer 42 is disposed between color filters 31 with different colors, and the light transmission part LTP is formed by the polarizer 42, and a fingerprint in contact with the display panel are pin-hole imaged on the fingerprint identification sensor 35 through the first opening K1.

In another embodiment of the present disclosure, the present embodiment is an extension of the aforementioned embodiments. The fingerprint identification sensor 35 in the aforementioned embodiments is disposed at the bottom of the display panel, and the fingerprint identification sensor 35 in the present embodiment is disposed inside the display panel. The fingerprint identification sensor 35 of the present embodiment may be a PIN-type photoelectric sensor 43 manufactured by an amorphous silicon process.

Figure 23:
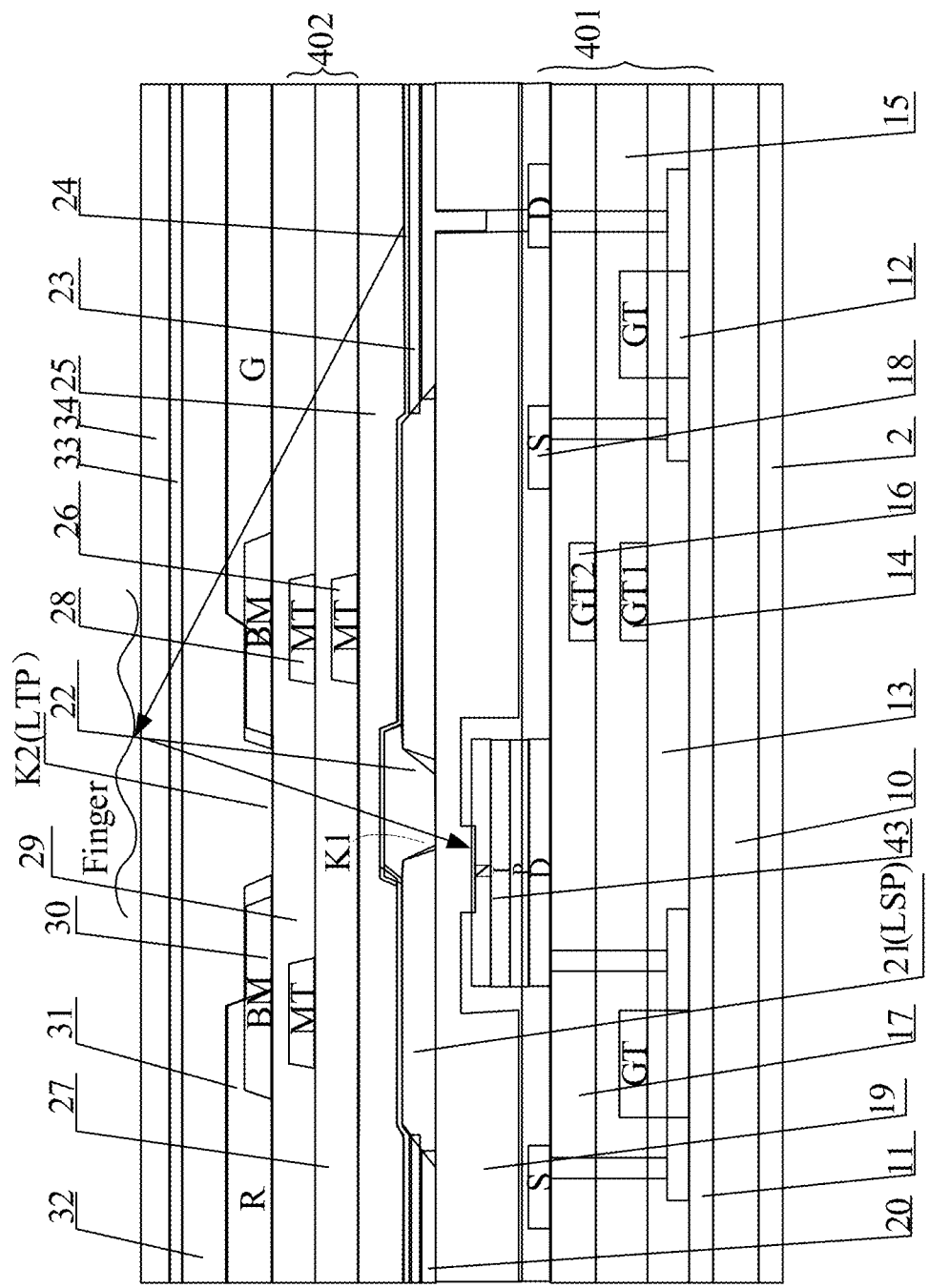
FIG. 23 is a first schematic diagram of a structure of a display panel according to another embodiment of the present disclosure.
Figure 24:
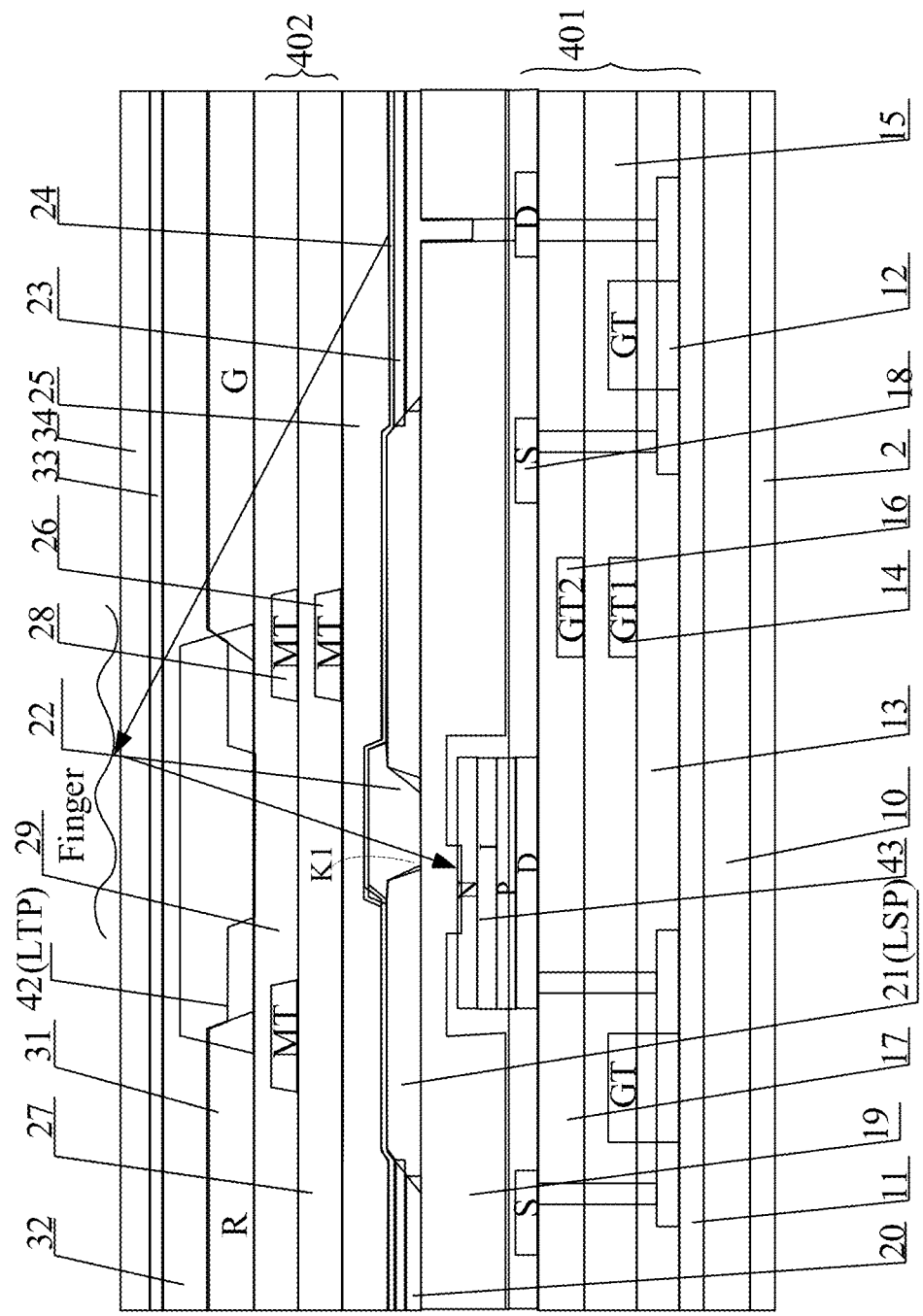
FIG. 24 is a second schematic diagram of a structure of a display panel according to another embodiment of the present disclosure.

As shown in FIG. 23 and FIG. 24, the display panel provided in the present embodiment includes multiple pixel units disposed in a matrix, and each pixel unit includes multiple sub-pixels. For example, each pixel unit may include three sub-pixels, namely red sub-pixel R, green sub-pixel G and blue sub-pixel B. In the display panel of the present embodiment, a PIN-type photoelectric sensor 43 is provided on a drive structure layer 401, the drive structure layer 401 includes a second thin film transistor, and the PIN-type photoelectric sensor 43 is connected to the second thin film transistor in the drive structure layer 401.

As shown in FIGS. 23 and 24, the display panel includes a base substrate 10, and the drive structure layer 401, a photoelectric sensor layer, a first planarization layer 19, a first electrode 20, a pixel define layer 21, a spacer layer 22, an organic light emitting layer 23, a second electrode 24, an encapsulation layer 25, a touch structure layer 402, a color film layer, a coating protective layer 32 and a cover plate 34 which are disposed on the base substrate 10.

The drive structure layer 401 disposed on the base substrate 10 and the drive structure layer 401 in each sub-pixel includes a first thin film transistor and a second thin film transistor. The photoelectric sensor layer is disposed on the drive structure layer 401 and includes a PIN-type photoelectric sensor 43 connected to the second thin film transistor in the drive structure layer 401, the second thin film transistor is used to turn on or off the PIN photoelectric sensor 43. The first planarization layer 19 is disposed on the photoelectric sensor layer. The first electrode 20 is disposed on the first planarization layer 19 and connected to the first thin film transistor in the drive structure layer 401 through a via hole provided on the first planarization layer 19. The pixel define layer 21 disposed on the first planarization layer 19 and includes multiple pixel openings and retaining walls around the pixel openings, wherein the pixel openings expose the first electrodes 20. The spacer layer 22 is disposed on the pixel define layer 21. The organic light emitting layer 23 is disposed on the first electrode 20. The second electrode 24 is disposed on the organic light emitting layer 23. The encapsulation layer 25 disposed on the second electrode 24 and covers the entire base substrate 10. The touch structure layer 402 is disposed on the encapsulation layer 25, and the color film layer is disposed on the touch structure layer 402. The coating protective layer 32 is disposed on the color film layer. The cover plate 34 is disposed on the coating protective layer 32.

As shown in FIG. 23, the color film layer includes color filters 31 with different colors and a first black matrix 30 disposed between the color filters 31 with different colors. The first black matrix 30 is provided with a second opening K2, there is an overlapping area between an orthographic projection of the second opening K2 on the base substrate 10 and an orthographic projection of a fingerprint identification sensor 35 on the base substrate 10, the second opening K2 pin-hole images a fingerprint in contact with the display panel onto the fingerprint identification sensor 35, and the second opening K2 forms the light transmission part LTP.

As shown in FIG. 24, the color film layer includes color filters 31 with different colors and a polarizer 42 disposed between the color filters 31 with different colors, the polarizer 42 forms the light transmission part LTP, and the first opening K1 pin-hole images a fingerprint in contact with the display panel onto the fingerprint identification sensor 35.

A first light shield layer in the present embodiment may be an opaque organic material layer, which may be disposed on the first planarization layer 19 or the pixel define layer 21.

In an exemplary embodiment, as shown in FIG. 23, a material of the retaining walls is an organic light shield material, and a retaining wall is provided with a first opening K1, and the retaining wall forms the light shield part LSP.

In another exemplary embodiment, a material of the first planarization layer 19 is an organic light shield material, the first planarization layer 19 is provided with a first opening K1, and the first planarization layer 19 forms the light shield part LSP.

In an exemplary embodiment, a distance between the cover plate 34 and the first opening K1 in the direction perpendicular to the display panel is greater than a distance between the first opening K1 and the fingerprint identification sensor 35 in the direction perpendicular to the display panel.

The present embodiment also achieves the technical effects of the aforementioned embodiments, which includes blocking out stray light through the light shield part LSP, allowing fingerprint reflected light to transmit and reach the fingerprint identification sensor 35 through the light transmission part LTP and the first opening K1, and enabling light to pass through the screen for fingerprint identification without increasing power consumption with the advantages of simple manufacturing process, high production efficiency, low production cost and high yield, etc., which has a great application prospect. In the present embodiment, a pin-type photoelectric sensor 43 is disposed on a drive structure layer 401, and a second thin film transistor disposed in the drive structure layer 401 is used to turn on or off the pin-type photoelectric sensor 43.

In another embodiment of the present disclosure, the present embodiment is an extension of the aforementioned embodiments. A display panel of the present embodiment is provided with a filter layer 44 on a fingerprint identification sensor 35, and the filter layer 44 is disposed on a path where the fingerprint reflected light pass through the first opening K1 to reach the fingerprint identification sensor.

Figure 25:
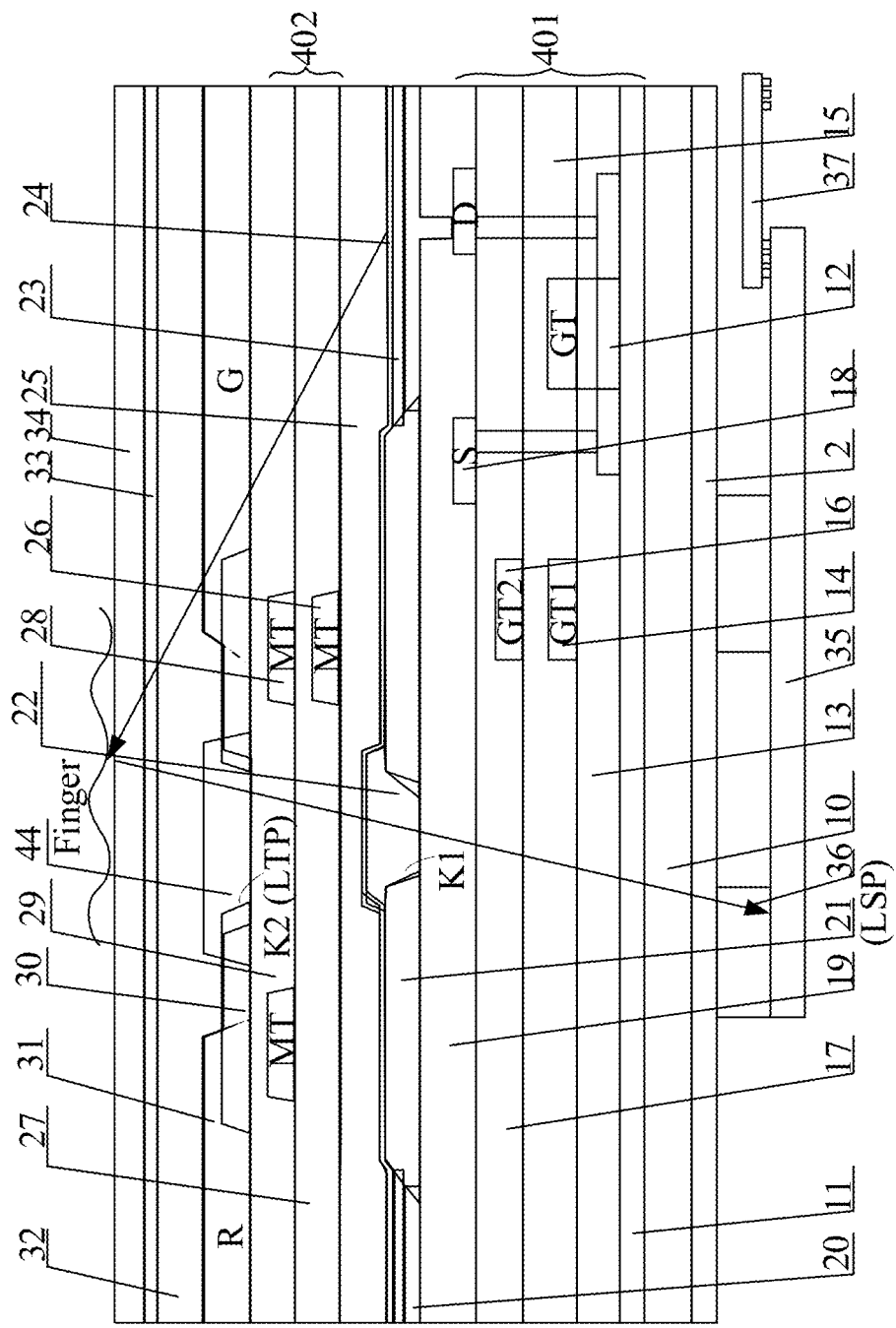
FIG. 25 is a first schematic diagram of a structure of a display panel according to another embodiment of the present disclosure.
Figure 26:
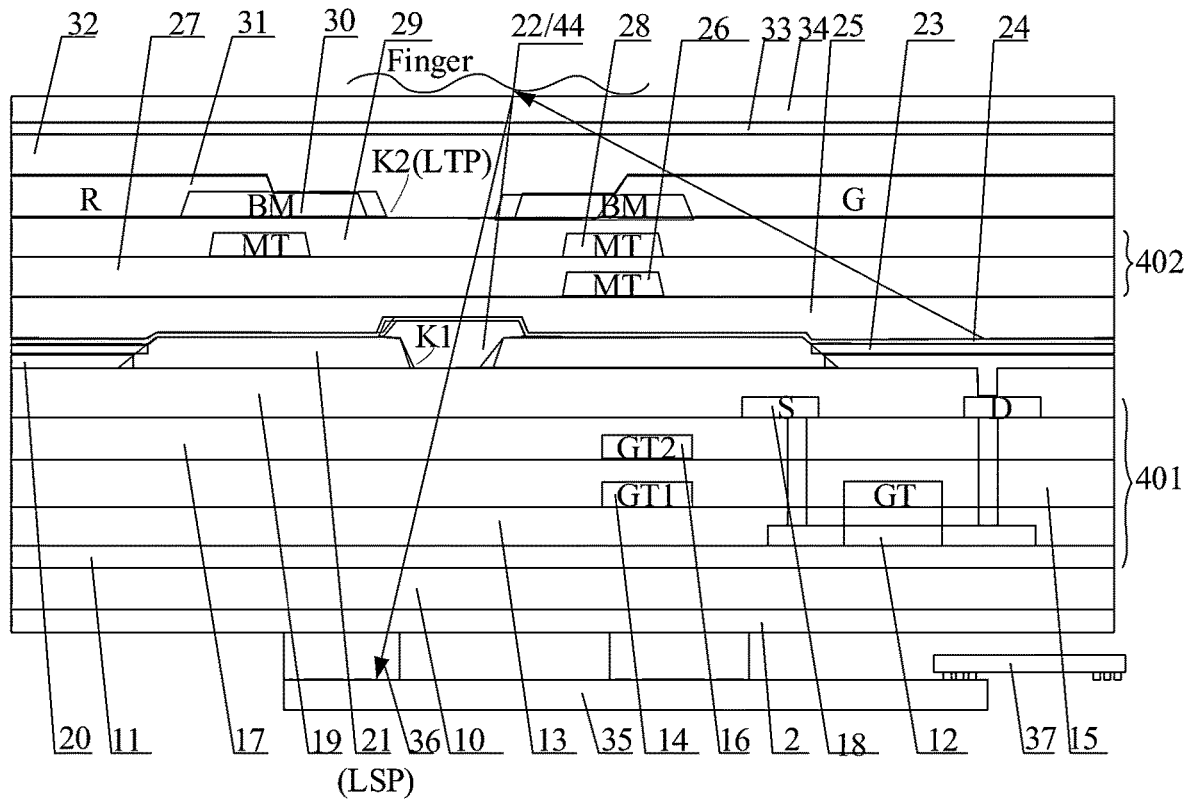
FIG. 26 is a second schematic diagram of a structure of a display panel according to another embodiment of the present disclosure.

As shown in FIGS. 25 and 26, the display panel according to the present embodiment includes a base substrate 10, and a drive structure layer 401, a first planarization layer 19, a first electrode 20, a pixel define layer 21, a spacer layer 22, an organic light emitting layer 23, a second electrode 24, an encapsulation layer 25, a touch structure layer 402, a color film layer, a coating protective layer 32 and a cover plate 34 which are disposed on the base substrate 10. The drive structure layer 401 disposed on the base substrate 10, and the drive structure layer 401 in each sub-pixel includes a first thin film transistor. The first planarization layer 19 is disposed on the drive structure layer 401. The first electrode 20 is disposed on the first planarization layer 19 and connected to the first thin film transistor in the drive structure layer 401 through a via hole provided on the first planarization layer 19. The pixel define layer 21 is disposed on the first planarization layer 19 and includes multiple pixel openings and retaining walls around the pixel openings, wherein the pixel openings expose the first electrodes 20. The spacer layer 22 is disposed on the pixel define layer 21. The organic light emitting layer 23 is disposed on the first electrode 20. The second electrode 24 is disposed on the organic light emitting layer 23. The encapsulation layer 25 is disposed on the second electrode 24 and covers the entire base substrate 10. The touch structure layer 402 is disposed on the encapsulation layer 25. The color film layer is disposed on the touch structure layer 402. The coating protective layer 32 is disposed on the color film layer. The cover plate 34 is disposed on the coating protective layer 32.

In an exemplary embodiment, as shown in FIG. 25 and FIG. 26, a color film layer includes color filters 31 with different colors and a first black matrix 30 disposed between the color filters 31 with different colors. The first black matrix 30 is provided with a second opening K2. There is an overlapping area between an orthographic projection of the second opening K2 on a base substrate 10 and an orthographic projection of a fingerprint identification sensor 35 on the base substrate 10. The second opening K2 pin-hole images a fingerprint in contact with the display panel onto the fingerprint identification sensor 35 and the second opening K2 forms the light transmission part.

In an exemplary embodiment, the filter layer 44 is disposed on a light transmission part LTP between the color filters 31 with different colors.

In an exemplary embodiment, as shown in FIG. 25, the filter layer 44 is disposed on a same layer as the color film layer, and the filter layer 44 includes multiple filters with a first color, each of the multiple filters with the first color covers one second opening K2. The filters with the first color are used for filtering out light which interferes with fingerprint reflected light. For example, the filters with the first color may filter out light (such as infrared light) that may pass through a finger in external light.

In an exemplary embodiment, the filters with the first color are green filters (referring to filters that may transmit green light) or cyan filters (referring to filters that may transmit cyan light).

Under-screen fingerprint identification uses light which is emitted by OLED and reflected by a human finger and then enters a fingerprint identification sensor under a screen. Ridges on the finger reflect the light differently, thus bright and dark stripes are formed. Because a human finger has a certain transmittance to infrared light, red light is not emitted when the fingerprint identification is performed, instead, green light (with high luminous efficiency) is adopted or green light and blue light are adopted. However, a human finger has a certain transmittance to infrared light, so infrared light in external light will also enter the fingerprint identification sensor through the finger, which will interference with a real fingerprint signal. In the display panel of the embodiment of the present disclosure, a layer of green or cyan filters are manufactured above the fingerprint identification sensor 35, which are used to filter out infrared light transmitted by external light through the finger.

In another exemplary embodiment, as shown in FIG. 26, the spacer layer 22 includes a filter material of a first color, and the spacer layer 22 serves as the filter layer 44. The filter material of the first color is used for filtering out light which interferes with the reflected light of a fingerprint. For example, the filter material of the first color is a green filter material (which may transmit green light) or a cyan filter material (which may transmit cyan light).

In an exemplary embodiment, a filter layer in the present embodiment may be placed at any position on a light path where fingerprint reflected light enters the fingerprint identification sensor through the first opening K1, which is not limited in the present disclosure.

The present embodiment also achieves the technical effects of the aforementioned embodiments, which includes blocking out stray light through the light shield part LSP, allowing fingerprint reflected light to transmit and reach the fingerprint identification sensor 35 through the light transmission part LTP and the first opening K1, and enabling light to pass through the screen for fingerprint identification without increasing power consumption with the advantages of simple manufacturing process, high production efficiency, low production cost and high yield, etc, which has a great application prospect. In addition, in the present embodiment, the filter layer 44 is disposed on the path where the fingerprint reflected light passes through the first openings K1 to reach the fingerprint identification sensor, so as to filter out the infrared light in the external light and enhance the fingerprint identification effect.

Figure 27:
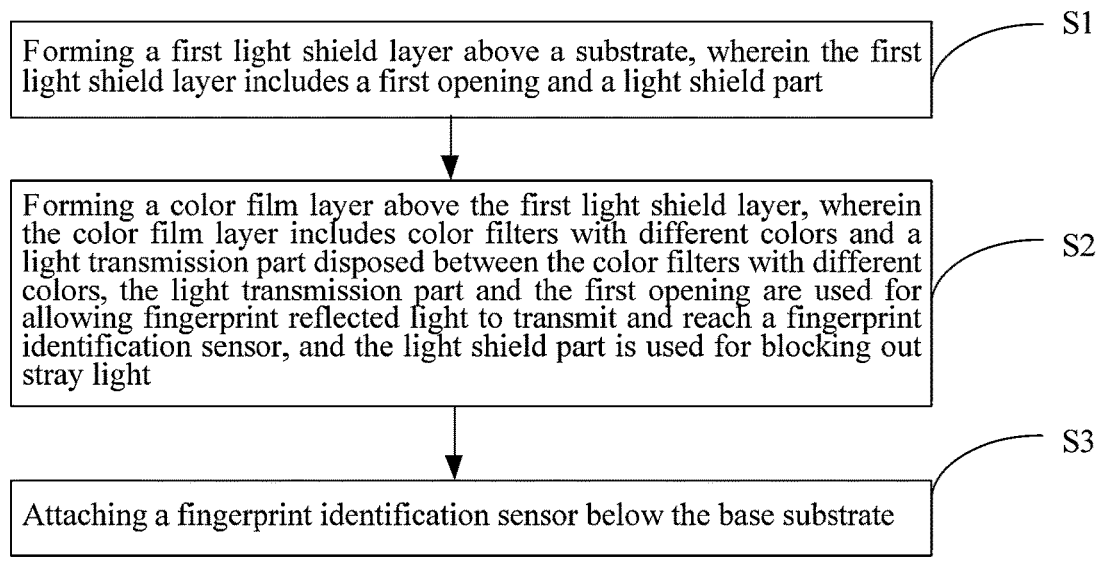
FIG. 27 is a schematic flow chart of a method for manufacturing a display panel according to another embodiment of the present disclosure.

In another embodiment of the present disclosure, a method for manufacturing a display panel is further provided. As shown in FIG. 27, a method for manufacturing a display panel according to an embodiment of the present disclosure includes:

S1. forming a first light shield layer above a base substrate, wherein the first light shield layer includes a first opening and a light shield part.

S2. forming a color film layer above the first light shield layer, wherein the color film layer includes color filters with different colors and a light transmission part disposed between the color filters with different colors, the light transmission part and the first opening are used for allowing fingerprint reflected light to transmit and reach a fingerprint identification sensor, and the light shield part is used for blocking out stray light.

S3. attaching the fingerprint identification sensor below the base substrate.

In an exemplary embodiment, forming the first light shield layer above the base substrate in S1 may include any one of the following:

the base substrate including a first base substrate and a second base substrate, forming the first light shield layer on the first base substrate, and forming the second base substrate on a surface of the first light shield layer away from the first base substrate;

forming the first light shield layer on the base substrate, and forming a pixel structure layer on the first light shield layer;

forming a pixel structure layer on the substrate, wherein the pixel structure layer includes a buffer layer, an active layer, a first gate insulating layer, a first gate electrode layer, a second gate insulating layer, a second gate electrode layer, a first interlayer insulating layer, a first source-drain metal layer, a second interlayer insulating layer and a second source-drain metal layer which are sequentially stacked on the base substrate and the second source-drain metal layer forms the first light shield layer;

forming a pixel structure layer on base the substrate, forming a first planarization layer on a surface of the pixel structure layer away from the base substrate, forming a first electrode and a pixel define layer on a surface of the first planarization layer away from the pixel structure layer, wherein the pixel define layer includes multiple openings and retaining walls around the openings, the first openings expose the first electrode, the retaining walls are provided with first openings, a material of the retaining walls is an organic light shield material, and the retaining walls form the first light shield layer; and forming a pixel structure layer on the base substrate, and forming a first planarization layer on a surface of the pixel structure layer away from the base substrate, wherein the first planarization layer is made of an organic light shield material and is provided with a first opening, and the first planarization layer forms the first light shield layer.

In an exemplary embodiment, the color film layer includes color filters with different colors and a first black matrix disposed between the color filters with different colors. Before attaching the fingerprint identification sensor under the base substrate, the method further includes:

providing the first black matrix with a second opening, there is an overlapping area between an orthographic projection of the second opening on a base substrate and an orthographic projection of the fingerprint identification sensor on the base substrate, and the second opening pin-hole images a fingerprint in contact with the display panel onto the fingerprint identification sensor, and the second opening forms the light transmission part.

In another exemplary embodiment, the color film layer includes color filters with different colors and a polarizer disposed between the color filters with different colors, the polarizer forms the light transmission part, and the first opening pin-hole images a fingerprint in contact with the display panel onto the fingerprint identification sensor.

In an exemplary embodiment, before forming the color film layer above the first light shield layer, the method further includes:

forming a touch structure layer above the first light shield layer, wherein the touch structure layer includes multiple touch electrodes, and an orthographic projection of the touch electrodes on a base substrate does not overlap with an orthographic projection of an organic light emitting layer on the base substrate.

In another exemplary embodiment, after forming the color film layer above the first light shield layer, the method further includes:

forming a touch structure layer and a second black matrix layer above the color film layer, wherein the second black matrix layer includes multiple second black matrices, and the multiple second black matrices are provided with third openings and the touch structure layer includes multiple touch electrodes; an orthographic projection of the second black matrices on the base substrate covers an orthographic projection of the touch electrodes on the base substrate, and there is an overlapping area between an orthographic projection of the third openings on the base substrate and an orthographic projection of the first openings on the base substrate.

In another embodiment of the present disclosure, a method for manufacturing a display panel according to an embodiment of the present disclosure includes:

forming a drive structure layer above a base substrate;
forming a fingerprint identification sensor on a surface of the drive structure layer away from the base substrate;
forming a first light shield layer above the fingerprint identification sensor, wherein the first light shield layer includes a first opening and a light shield part;
forming a color film layer above the first light shield layer, wherein the color film layer includes color filters with different colors and a light transmission part disposed between the color filters with different colors, wherein the light transmission part and the first opening are used for allowing fingerprint reflected light to transmit and reach the fingerprint identification sensor, and the light shield part is used for blocking out stray light.

In the present embodiment, the structures, materials, relevant parameters and detailed manufacturing processes of display panel have been described in detail in the above embodiments, and will not be described here again.

According to the method for manufacturing the display panel provided in the present embodiment, stray light is blocked out by the light shield part, and fingerprint reflected light is allowed to transmit and reach the fingerprint identification sensor through the light transmission part and the first opening, so that light may pass through the screen for fingerprint identification without increasing power consumption with advantages of simple manufacturing process, high production efficiency, low production cost and high yield, etc., which has a great application prospect.

In another embodiment of the present disclosure, a display apparatus including the display panel of the above-mentioned embodiments is further provided. The display apparatus may be any product or component with a display function such as a mobile phone, a tablet computer, a television, a display, a laptop computer, a digital photo frame, a navigator, etc.

In the description of the present disclosure, it should be understood that an orientation or position relationship indicated by the terms "middle", "upper", "lower", "front", "rear", "vertical", "horizontal", "top", "bottom", "inner", "outer" and the like is based on the orientation or position relationship shown in the accompanying drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of embodiments of the present disclosure, it should be noted that unless otherwise clearly specified and defined, the terms "install", "connect", "couple" should be broadly interpreted, for example, it may be connected fixedly or connected detachably, or integrated; it may be a mechanical connection or an electrical connection; it may be directly connected, or may be indirectly connected through an intermediary, or may be an internal connection between two elements. For those of ordinary skills in the art, the specific meanings of the above terms in the present disclosure may be understood according to specific situations.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

The invention claimed is:

1. A display panel, comprising a sensor area, a first light shield layer disposed above the sensor area, and a color film layer disposed above the first light shield layer, wherein:

the color film layer comprises color filters with different colors and a light transmission part disposed between the color filters with different colors;

the first light shield layer comprises a first opening and a light shield part, wherein the light transmission part and the first opening are configured to allow at least partial light to transmit the sensor area;

the color film layer further comprises a first black matrix disposed between the color filters with different colors, the first black matrix is provided with a second opening which forms the light transmission part, there is an overlapping area between an orthographic projection of the second opening on a base substrate and an orthographic projection of the first opening on the base substrate;

the display panel further comprises a touch structure layer, wherein the touch structure layer comprises a plurality of touch electrodes, and there is no overlapping between an orthographic projection of the touch electrodes on the base substrate and an orthographic projection of the first opening on the base substrate; and there is no overlapping between the orthographic projection of the touch electrodes on the base substrate and an orthographic projection of the second opening on the base substrate.

2. The display panel according to claim 1, wherein
there is an overlapping between an orthographic projection of the first black matrix on the base substrate and the orthographic projection of the touch electrodes on the base substrate; and/or
there is an overlapping between an orthographic projection of the first light shield layer on the base substrate and the orthographic projection of the touch electrodes on the base substrate.

3. The display panel according to claim 1, wherein the first light shield layer comprises a plurality of first openings and the plurality of first openings are arranged at intervals, and a distance between two adjacent first openings ranges from 20 μm to 800 μm.

4. The display panel according to claim 1, wherein a distance between an edge of the orthographic projection of the touch electrodes and an edge of the orthographic projection of the first opening on the base substrate is between 0 μm and 20 μm.

5. The display panel according to claim 1, further comprising a cover plate, wherein a distance between the cover plate and the second opening in a direction perpendicular to the display panel is greater than a distance between the second opening and the sensor area in the direction perpendicular to the display panel; an aperture of the second opening is smaller than or equal to an aperture of the first opening.

6. The display panel according to claim 1, further comprising a plurality of pixel units disposed in a matrix on the base substrate, wherein each pixel unit comprises a plurality of sub-pixels, and each sub-pixel comprises a drive structure layer, a first planarization layer, a first electrode and a pixel define layer,
wherein the drive structure layer is disposed on the base substrate, and the drive structure layer in each sub-pixel comprises a first thin film transistor;
the first planarization layer is disposed on the drive structure layer;
the first electrode is disposed on the first planarization layer and connected to the first thin film transistor in the drive structure layer through a via hole provided on the first planarization layer; and
the pixel define layer is disposed on the first planarization layer and comprises a plurality of pixel openings and retaining walls around the pixel openings, and the pixel openings expose the first electrode.

7. The display panel according to claim 6, wherein each sub-pixel further comprises a spacer layer, an organic light emitting layer, a second electrode and an encapsulation layer,
wherein the spacer layer is disposed on the pixel define layer;
the organic light emitting layer is disposed on the first electrode;
the second electrode is disposed on the organic light emitting layer; and/or
the encapsulation layer is disposed on the second electrode, and a projection of the encapsulation layer on the base substrate covers the entire substrate.

8. The display panel according to claim 7, further comprising a filter layer disposed above the sensor area, wherein the filter layer is disposed on the light transmission part between the color filters with different colors, or the spacer layer comprises a filter material with a first color as the filter layer, and the filter material with the first color is configured to filter out light that interferes with a fingerprint reflected light.

9. The display panel according to claim 6, wherein each sub-pixel further comprises the color film layer and an encapsulation layer,
wherein the color film layer is disposed on the encapsulation layer;
the display panel further comprises a touch structure layer disposed between the encapsulation layer and the color film layer,
wherein the touch structure layer comprises a plurality of touch electrodes, and an orthographic projection of the touch electrodes on the base substrate does not overlap with an orthographic projection of the organic light emitting layer on the base substrate.

10. The display panel according to claim 6, wherein a material of a retaining wall is an organic light shield material, the retaining wall is provided with the first opening and forms the light shield part.

11. The display panel according to claim 6, wherein a material of the first planarization layer is an organic light shield material, the first planarization layer is provided with the first opening, and forms the light shield part.

12. The display panel according to claim 6, wherein the drive structure layer comprises a buffer layer, an active layer, a first gate insulating layer, a first gate electrode layer, a second gate insulating layer, a second gate electrode layer, a first interlayer insulating layer, a first source-drain metal layer, a second interlayer insulating layer and a second source-drain metal layer which are sequentially stacked on the base substrate, and the second source-drain metal layer is provided with the first opening and forms the first light shield layer.

13. The display panel according to claim 6, wherein the drive structure layer comprises a buffer layer, an active layer, a first gate insulating layer, a first gate electrode layer, a second gate insulating layer, a second gate electrode layer, a first interlayer insulating layer and a first source-drain metal layer which are sequentially stacked on the base substrate, and the first light shield layer is disposed between the base substrate and the buffer layer.

14. The display panel according to claim 6,
wherein the base substrate comprises a first base substrate and a second base substrate, and the first light shield layer is disposed between the first base substrate and the second base substrate; and/or
a base film is disposed on a surface of the base substrate away from the drive structure layer, and the sensor area is attached to a surface of the base film away from the base substrate.

15. The display panel according to claim 6, wherein the sensor area is disposed between the drive structure layer and the first planarization layer, and the drive structure layer further comprises a second thin film transistor which is configured to turn on or off the sensor area.

16. The display panel according to claim 6, further comprising a filter layer disposed above the sensor area and on a path where a fingerprint reflected light passes through the first opening to reach the sensor area.

17. The display panel according to claim 1, wherein the color film layer further comprises a polarizer disposed between the color filters with different colors, the polarizer forms the light transmission part, and the first opening pin-hole images a fingerprint in contact with the display panel onto the sensor area.

18. The display panel according to claim 17, further comprising a cover plate, wherein a distance between the cover plate and the first opening in a direction perpendicular to the display panel is greater than a distance between the first opening and the sensor area in the direction perpendicular to the display panel.

19. The display panel according to claim 1, further comprising a touch structure layer and a second black matrix layer sequentially stacked on the color film layer, wherein the touch structure layer comprises a plurality of touch electrodes;

the second black matrix layer comprises a plurality of second black matrices with third openings, an orthographic projection of the second black matrices on the base substrate covers an orthographic projection of the touch electrodes on the base substrate, and there is an overlapping area between an orthographic projection of a third opening on the base substrate and an orthographic projection of the first opening on the base substrate.

20. A display apparatus, comprising the display panel according to claim 1.

* * * * *